US006824666B2

(12) United States Patent
Gandikota et al.

(10) Patent No.: US 6,824,666 B2
(45) Date of Patent: Nov. 30, 2004

(54) ELECTROLESS DEPOSITION METHOD OVER SUB-MICRON APERTURES

(75) Inventors: Srinivas Gandikota, Santa Clara, CA (US); Chris R. McGuirk, San Jose, CA (US); Deenesh Padhi, San Jose, CA (US); Muhammad Atif Malik, Santa Clara, CA (US); Sivakami Ramanathan, Fremont, CA (US); Girish A. Dixit, San Jose, CA (US); Robin Cheung, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 390 days.

(21) Appl. No.: 10/059,822

(22) Filed: Jan. 28, 2002

(65) Prior Publication Data

US 2003/0140988 A1 Jul. 31, 2003

(51) Int. Cl.⁷ .............................. C23C 28/00; B05D 5/12
(52) U.S. Cl. ................... 205/183; 205/147; 205/184; 205/185; 205/187; 205/224; 205/225; 205/227; 427/97; 427/98; 427/99; 427/304; 427/305; 427/328; 427/437; 427/438; 428/936
(58) Field of Search .................. 205/147, 183, 205/184, 185, 187, 224, 225, 227; 427/97, 98, 99, 304, 305, 328, 437, 438; 428/936

(56) References Cited

U.S. PATENT DOCUMENTS

| 2,369,620 A | 2/1945 | Sullivan et al. ............. 117/130 |
| 3,937,857 A | 2/1976 | Brummett et al. ............ 427/98 |
| 4,006,047 A | 2/1977 | Brummett et al. .......... 156/656 |
| 4,232,060 A | 11/1980 | Mallory et al. ............... 427/98 |

(List continued on next page.)

FOREIGN PATENT DOCUMENTS

| EP | 0 329 406 | 8/1989 | ........... C23C/28/02 |
| EP | 0 475 567 | 3/1992 | ............ H05K/1/09 |
| EP | 0 913 498 | 5/1999 | ........... C23C/18/16 |
| GB | 2285174 | 6/1995 | ........... H01L/23/52 |
| JP | 7-297543 | 11/1995 | ............ H05K/3/38 |
| JP | 11-124682 | 5/1999 | ........... C23C/18/31 |
| WO | WO 99/54920 | 10/1999 | |

OTHER PUBLICATIONS

USSN 09/599,125 (Cheung, et al.), filed Jun. 22, 2000.
USSN 09/650,108 (Carl, et al.), filed Aug. 29, 2000.

(List continued on next page.)

*Primary Examiner*—Robert R. Koehler
(74) *Attorney, Agent, or Firm*—Moser, Patterson & Sheridan

(57) ABSTRACT

An apparatus and a method of depositing a catalytic layer comprising at least one metal selected from the group consisting of noble metals, semi-noble metals, alloys thereof, and combinations thereof in sub-micron features formed on a substrate. Examples of noble metals include palladium and platinum. Examples of semi-noble metals include cobalt, nickel, and tungsten. The catalytic layer may be deposited by electroless deposition, electroplating, or chemical vapor deposition. In one embodiment, the catalytic layer may be deposited in the feature to act as a barrier layer to a subsequently deposited conductive material. In another embodiment, the catalytic layer may be deposited over a barrier layer. In yet another embodiment, the catalytic layer may be deposited over a seed layer deposited over the barrier layer to act as a "patch" of any discontinuities in the seed layer. Once the catalytic layer has been deposited, a conductive material, such as copper, may be deposited over the catalytic layer. In one embodiment, the conductive material is deposited over the catalytic layer by electroless deposition. In another embodiment, the conductive material is deposited over the catalytic layer by electroless deposition followed by electroplating or followed by chemical vapor deposition. In still another embodiment, the conductive material is deposited over the catalytic layer by electroplating or by chemical vapor deposition.

102 Claims, 15 Drawing Sheets

U.S. PATENT DOCUMENTS

| | | | | |
|---|---|---|---|---|
| 4,234,628 | A | 11/1980 | DuRose | 427/305 |
| 4,265,943 | A | 5/1981 | Goldstein et al. | 427/305 |
| 4,364,803 | A | 12/1982 | Nidola et al. | 204/30 |
| 4,368,223 | A | 1/1983 | Kobayashi et al. | 427/443.1 |
| 4,397,812 | A | 8/1983 | Mallory et al. | 420/441 |
| 4,632,857 | A | 12/1986 | Mallory, Jr. | 428/209 |
| 4,639,380 | A * | 1/1987 | Amelio et al. | 427/97 |
| 4,810,520 | A | 3/1989 | Wu | 427/8 |
| 5,147,692 | A | 9/1992 | Bengston | 427/438 |
| 5,235,139 | A | 8/1993 | Bengston et al. | 174/257 |
| 5,240,497 | A | 8/1993 | Shacham et al. | 106/1.26 |
| 5,248,527 | A | 9/1993 | Uchida et al. | 427/437 |
| 5,380,560 | A | 1/1995 | Kaja et al. | 427/306 |
| 5,384,284 | A | 1/1995 | Doan et al. | 437/190 |
| 5,415,890 | A | 5/1995 | Kloiber et al. | 427/242 |
| 5,478,462 | A | 12/1995 | Walsh | 205/169 |
| 5,510,216 | A | 4/1996 | Calabrese et al. | 430/16 |
| 5,648,125 | A | 7/1997 | Cane | 427/534 |
| 5,674,787 | A | 10/1997 | Zhao et al. | 437/230 |
| 5,695,810 | A | 12/1997 | Dubin et al. | 427/96 |
| 5,733,816 | A | 3/1998 | Iyer et al. | 438/592 |
| 5,824,599 | A | 10/1998 | Schacham-Diamond et al. | 438/678 |
| 5,843,538 | A | 12/1998 | Ehrsam et al. | 427/601 |
| 5,846,598 | A | 12/1998 | Semkow et al. | 427/98 |
| 5,885,749 | A | 3/1999 | Huggins et al. | 430/312 |
| 5,891,513 | A | 4/1999 | Dubin et al. | 427/98 |
| 5,904,827 | A | 5/1999 | Reynolds | 205/68 |
| 5,907,790 | A | 5/1999 | Kellam | 438/666 |
| 5,910,340 | A | 6/1999 | Uchida et al. | 427/437 |
| 5,913,147 | A | 6/1999 | Dubin et al. | 438/687 |
| 5,932,077 | A | 8/1999 | Reynolds | 204/224 R |
| 5,969,422 | A | 10/1999 | Ting et al. | 257/762 |
| 6,010,962 | A | 1/2000 | Liu et al. | 438/687 |
| 6,015,724 | A | 1/2000 | Yamazaki | 438/151 |
| 6,015,747 | A | 1/2000 | Lopatin et al. | 438/586 |
| 6,065,424 | A | 5/2000 | Shacham-Diamond et al. | 118/696 |
| 6,077,780 | A | 6/2000 | Dubin | 438/687 |
| 6,090,261 | A | 7/2000 | Mathieu | 205/137 |
| 6,107,199 | A | 8/2000 | Allen et al. | 438/685 |
| 6,110,530 | A | 8/2000 | Chen et al. | 427/253 |
| 6,113,771 | A | 9/2000 | Landau et al. | 205/123 |
| 6,136,163 | A | 10/2000 | Cheung et al. | 204/198 |
| 6,136,693 | A | 10/2000 | Chan et al. | 438/633 |
| 6,140,234 | A | 10/2000 | Uzoh et al. | 438/678 |
| 6,171,661 | B1 | 1/2001 | Zheng et al. | 427/535 |
| 6,174,812 | B1 | 1/2001 | Hsiung et al. | 438/687 |
| 6,180,523 | B1 | 1/2001 | Lee et al. | 438/678 |
| 6,197,181 | B1 | 3/2001 | Chen | 205/123 |
| 6,197,688 | B1 | 3/2001 | Simpson | 438/678 |
| 6,228,233 | B1 | 5/2001 | Lakshmikanthan et al. | 204/277 |
| 6,242,349 | B1 | 6/2001 | Nogami et al. | 438/687 |
| 6,245,670 | B1 | 6/2001 | Cheung et al. | 438/637 |
| 6,251,236 | B1 | 6/2001 | Stevens | 204/224 R |
| 6,258,220 | B1 | 7/2001 | Dordi et al. | 204/198 |
| 6,258,223 | B1 | 7/2001 | Cheung et al. | 204/242 |
| 6,258,270 | B1 | 7/2001 | Hilgendorff et al. | 210/321.75 |
| 6,291,348 | B1 | 9/2001 | Lopatin et al. | 438/687 |
| 6,416,647 | B1 | 7/2002 | Dordi et al. | 205/137 |
| 6,432,819 | B1 | 8/2002 | Pavate et al. | 438/676 |
| 2002/0064592 | A1 * | 5/2002 | Datta et al. | 427/98 |

OTHER PUBLICATIONS

USSN 09/505,638 (Parke, et al.), filed Feb. 16, 2000.
USSN 09/294,240, (Dordi, et al.), filed Apr. 19, 1999.
USSN 09/522,726 (Kalyanam, et al.), filed Mar. 10, 2000.
USSN 09/245,780 (Dordi, et al.), filed Feb. 5, 1999.
USSN 09/406,325 (Pavate, et al), filed Sep. 27, 1999.
Lin, et al., "Manufacturing of Cu Electroless Nickel/Sn–Pb Flip Chip Solder Bumps", IEEE Transactions on Advanced Packaging, vol. 22, No. 4 (Nov. 1999), pp. 575–579.
Lopatin, et al., "Thin Electroless barrier for copper films", Part of the SPIE Conference of Multilevel Interconnect technology II, SPIE vol. 3508 (1998), pp. 65–77 (no month given).
Lowenheim, Frederick A., *Modern Electroplating*, Chapter 31, pp. 70–79 ($3^{rd}$ ed., Wiley & Sons 1974) (no month given).
Schacham–Diamond, et al. Material properties of electroless 100–200 nm thick CoWP films, Electrochemical Society Proceedings, vol. 99–34, pp. 102–110, (no date).
Eze, et al., "Chemical–bath–deposited cobalt sulphide films: preparation effects," Materials Chemistry and Physics, 47 (1997), pp. 31–36, (no month given).
Shacham–Diamond, et al., "Electrochemically deposited thin film alloys for ULSI and MEMS applications," Microelectronic Engineering 50 (2000), pp. 525–531, (no month given).
Saito, et al., "Electroless deposition of Ni–B, Co–B and Ni–Co–B alloys using dimethylamineborane as a reducing agent," Journal of Applied Electrochemistry 28 (1998), pp. 559–563, (no month given).
Eze, F. C., "Electroless deposition of CoO thin films," J. Phys. D: Appl. Phys. 32 (1999), pp. 533–540, (no month given).
The Chinese Journal of Nonferrous Metals, vol. 10, No. 1, Feb. 2, 2000.
Pearlstein, Fred. "Electroless Plating," J. Res. Natl. Bur. Stan., Ch. 31 (1963), pp. 710–747, (no month given).
PCT Partial Search Report from International Application No. PCT/US03/01753, Dated May 15, 2003.

* cited by examiner

ELECTROLESS DEPOSITION METHOD OVER SUB-MICRON APERTURES

BACKGROUND OF THE INVENTION

1. Field of the Invention

The present invention generally relates to an apparatus and method of depositing a conductive material over sub-micron apertures formed on a substrate.

2. Description of the Related Art

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, contacts and other features, as well as the dielectric materials between them, decrease to sub-micron dimensions, whereas the thickness of the dielectric layers remains substantially constant, with the result that the aspect ratios for the features, i.e., their height divided by width, increases. Many traditional deposition processes have difficulty filling sub-micron structures where the aspect ratio exceeds 2:1, and particularly where the aspect ratio exceeds 4:1. Therefore, there is a great amount of ongoing effort being directed at the formation of substantially void-free, sub-micron features having high aspect ratios.

Currently, copper and its alloys have become the metals of choice for sub-micron interconnect technology because copper has a lower resistivity than aluminum, (1.7 $\mu\Omega$-cm compared to 3.1 $\mu\Omega$-cm for aluminum), and a higher current carrying capacity and significantly higher electromigration resistance. These characteristics are important for supporting the higher current densities experienced at high levels of integration and increased device speed. Further, copper has a good thermal conductivity and is available in a highly pure state.

Electroplating is one process being used to fill high aspect ratio features on substrates. Electroplating processes typically require a thin, electrically conductive seed layer to be deposited on the substrate. Electroplating is accomplished by applying an electrical current to the seed layer and exposing the substrate to an electrolytic solution containing metal ions which plate over the seed layer. The seed layer typically comprises a conductive metal, such as copper, and is conventionally deposited on the substrate using physical vapor deposition (PVD) or chemical vapor deposition (CVD) techniques. A continuous metal seed layer is essential for conducting the current required during electroplating. As feature sizes decrease, the ability to deposit conformal seed layers can be compromised. A discontinuous seed layer over the substrate may cause a number of problems during electroplating.

For example, when a discontinuity is present in the metal seed layer, the portion of the seed layer that is not electrically connected to the bias power supply does not receive deposition during the electroplating process. Particularly with physical vapor deposition of a seed layer, it is very difficult to deposit a continuous, uniform seed layer within a high aspect ratio, sub-micron feature. The seed layer tends to become discontinuous especially at the bottom surface of the feature because it is difficult to deposit material through the narrow (i.e., sub-micron) aperture of the feature. Discontinuities in the metal seed layer may cause void formations in high aspect ratio interconnect features. During the electroplating process, the metal deposits on all of the surfaces that are electrically connected to the bias power supply. Because the electroplated metal grows in all directions, the deposition around an area of discontinuity in the seed layer typically forms a bridge over the discontinuity, leaving a void adjacent the discontinuity within the feature. The void changes the operating characteristics of the interconnect feature and may cause improper operation and premature breakdown of the device. U.S. Pat. No. 6,197,181 entitled "Apparatus and Method For Electrolytically Depositing a Metal on a Microelectronic Workpiece" discloses repairing a PVD or CVD copper seed layer to form an "enhanced seed layer" by electroplating a copper layer by utilizing an alkaline plating solution. Bulk deposition is then performed by electroplating copper by utilizing an acidic plating solution which has higher deposition rates than with use of an alkaline solution. One problem with the disclosed process is that providing an "enhanced seed layer" depends on an electroplating process over a copper seed layer which may exhibit the problems discussed above.

Electroless deposition is another process used to deposit conductive materials. Although electroless deposition techniques have been widely used to deposit conductive metals over non-conductive printed circuit boards, electroless deposition techniques have not been extensively used for forming interconnects in VLSI and ULSI semiconductors. Electroless deposition involves an autocatalyzed chemical deposition process that does not require an applied current for the reaction to occur. Electroless deposition typically involves exposing a substrate to a solution by immersing the substrate in a bath or by spraying the solution over the substrate. Those of skill in the art in manufacturing printed circuit boards acknowledge the problems of utilizing electroless deposition techniques to deposit metals in high aspect ratio features, such as through-holes of printed-circuit boards having diameters of 0.028 inches or 0.018 inches. For example, U.S. Pat. No. 5,648,125, entitled "Electroless Plating Process For The Manufacture Of Printed Circuit Boards," which discloses an electroless nickel deposition process, states that the trend of smaller higher-aspect-ratio holes, such as 0.18 inch diameter through-holes, places increasing pressure on methodologies for producing printed circuit boards with regard to the always difficult task of properly plating the through-holes. (See, col. 4, lns. 25–46.)

U.S. Pat. No. 6,197,688 entitled "Interconnect Structure in a Semiconductor Device and Method of Formation," suggests materials for electroless deposition. The patent, however, does not disclose the processing conditions for the electroless deposition of the materials over sub-micron features. Accordingly, a satisfactory method of utilizing electroless deposition in the processing of substrates having sub-micron geometries has yet to be demonstrated.

Deposition of a conductive material in micron technology by electroless or electroplating techniques require a surface capable of electron transfer for nucleation of the conductive material to occur over that surface. Non-metal surfaces and oxidized surfaces are examples of surfaces which cannot participate in electron transfer. Barrier layers comprising titanium, titanium nitride, tantalum, and tantalum nitride are poor surfaces for nucleation of a subsequently deposited conductive material layer since native oxides of these barrier layer materials are easily formed. A seed layer, such as a copper seed layer, can serve as a surface capable of electron transfer. However, where there are discontinuities in the seed layer, nucleation of a subsequently deposited conductive material layer is incomplete and may not form uniformly over the seed layer.

Therefore, there is a need for an improved apparatus and method for depositing a conductive metal in sub-micron features formed in a substrate.

SUMMARY OF THE INVENTION

One embodiment provides an apparatus and a method of depositing a catalytic layer comprising at least one metal selected from the group consisting of noble metals, semi-noble metals, alloys thereof, and combinations thereof in sub-micron features formed on a substrate. The catalytic layer provides a surface capable of electron transfer for subsequent deposition and nucleation of a conductive material. Noble metals and semi-noble metals are not readily oxidized, and thus provide a surface capable of electron transfer. Examples of noble metals include gold, silver, platinum, palladium, iridium, rhenium, mercury, ruthenium, and osmium. In one embodiment, the noble metal used comprises palladium or platinum, and most preferably the noble metal comprises palladium. Examples of semi-noble metals include, iron, cobalt, nickel, copper, carbon, aluminum and tungsten. In another embodiment, the semi-noble metal used comprises cobalt, nickel, or tungsten. The catalytic layer may be deposited by electroless deposition, electroplating, or chemical vapor deposition. In one embodiment, the catalytic layer may be deposited in the feature to act as a barrier layer to a subsequently deposited conductive material. In one aspect, the catalytic/barrier layer comprises cobalt, tungsten or combinations thereof. In another embodiment, the catalytic layer may be deposited over a barrier layer. In yet another embodiment, the catalytic layer may be deposited over a seed layer deposited over the barrier layer to act as a "patch" of any discontinuities in the seed layer.

Once the catalytic layer has been deposited, a conductive material, such as copper, may be deposited over the catalytic layer. In one embodiment, the conductive material is deposited over the catalytic layer by electroless deposition. In another embodiment, the conductive material is deposited over the catalytic layer by electroless deposition followed by electroplating or chemical vapor deposition. In still another embodiment, the conductive material is deposited over the catalytic layer by electroplating. In yet another embodiment, the conductive material is deposited over the catalytic layer by chemical vapor deposition.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Figure 1A:
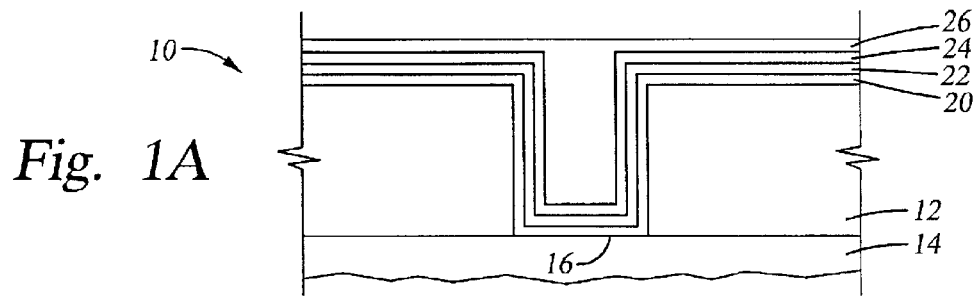
FIGS. 1A–D show schematic cross-sectional views of a feature filled by embodiments of the present method.

FIG. 1A shows a schematic cross-sectional view of a substrate structure 10 formed on a substrate 14 and filled by one method of the present invention. The substrate 14 refers to any workpiece upon which film processing is performed. For example, the substrate 14 may be a silicon semiconductor wafer, or other material layer, which has been formed on the wafer. A dielectric layer 12 is deposited over the substrate. The dielectric layer 12 may be an oxide, a silicon oxide, carbon-silicon-oxide, a fluoro-silicon, a porous dielectric, or other suitable dielectric. The dielectric layer 12 is patterned to provide a feature 16, such as a via, trench, contact hole, or line extending to an exposed surface portion of the substrate 14. It is also understood by those with skill in the art that the present invention may be used in a dual damascene process flow. The substrate structure 10 is used to denote the substrate 14 as well as other material layers formed on the substrate 14, such as the dielectric layer 12 and other subsequently deposited material layers.

Figure 1B:
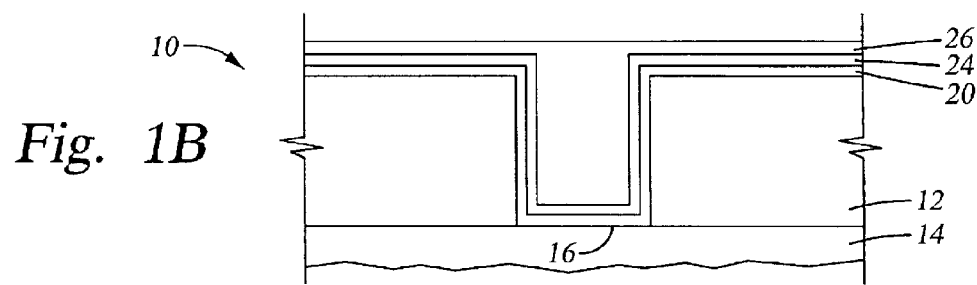
Figure 1C:
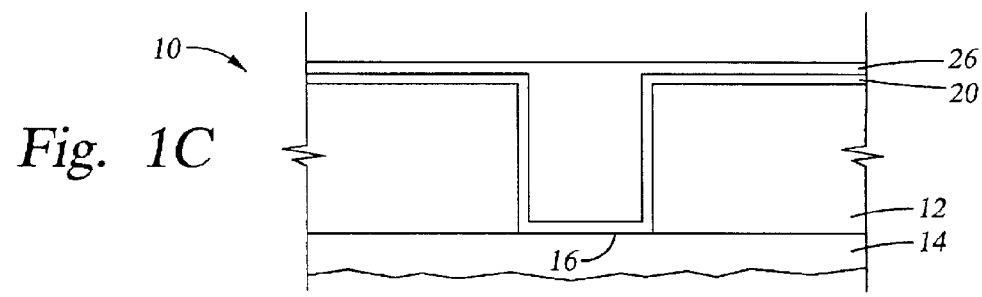
Figure 1D:
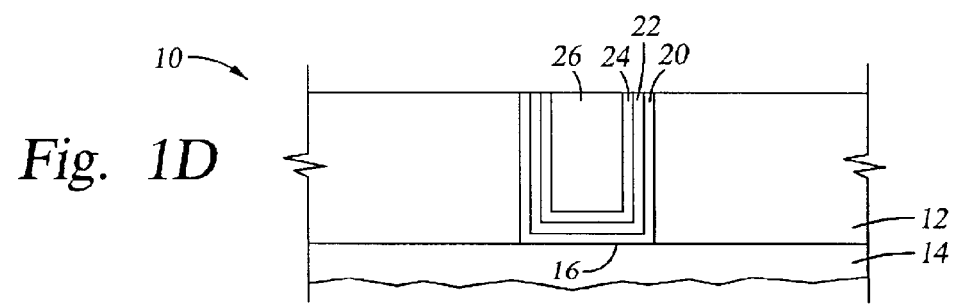

FIG. 1A shows one method of filling the feature 16 comprising depositing a barrier layer 20 over the substrate structure 10, depositing a seed layer 22 over the barrier layer 20, depositing a catalytic layer 24 over the seed layer 22, and filling the remaining aperture by depositing a conductive material layer 26. FIG. 1B shows a schematic cross-sectional view of feature 16 filled by another embodiment comprising depositing a barrier layer 20 over the substrate structure 10, depositing a catalytic layer 24 over the barrier layer 20, and filling the remaining aperture by depositing a conductive material layer 26. FIG. 1C shows a schematic cross-section view of feature 16 filled by still another embodiment comprising depositing a catalytic layer 20 over the substrate structure 10, and filling the remaining aperture by depositing a conductive material layer 26. For FIGS. 1A–1C, the conductive material layer 26 may be deposited by electroless deposition, electroplating, chemical vapor deposition, or a combination of electroless deposition followed by electroplating or chemical vapor deposition. The methods as shown in FIGS. 1A–1C may further comprise planarizing the top portion of the filled features, such as by chemical mechanical polishing. FIG. 1D shows a cross-sectional view of the filled feature of FIG. 1A planarized. The present methods have been observed to be suitable for filling of sub-half micron features, sub-quarter micron features, and sub-0.13 micron features.

Deposition of a Barrier Layer

The barrier layer 20 may be deposited to prevent or inhibit diffusion of subsequently deposited materials over the barrier layer into the underlying substrate or dielectric layers. Examples of barrier layer materials include refractory metals and refractory metal nitrides such as tantalum (Ta), tantalum nitride ($TaN_x$), titanium (Ti), titanium nitride ($TiN_x$), tungsten (W), tungsten nitride ($WN_x$), and combinations thereof. Other examples of barrier layer materials include PVD titanium stuffed with nitrogen, doped silicon, aluminum, aluminum oxides, titanium silicon nitride, tungsten silicon nitride, and combinations thereof. In one embodiment, a barrier layer comprising CoWP may be used which is more fully described in U.S. patent application Ser. No. 09/599,125 entitled "Method of Treating a Substrate," filed on Jun. 22, 2000, which is incorporated herein by reference to the extent not inconsistent with the invention.

The barrier layer may be deposited by CVD, PVD, electroless deposition techniques, or molecular beam epitaxy. The barrier layer may also be a multi-layered film deposited individually or sequentially by the same or by a combination of techniques.

Physical vapor deposition techniques suitable for the deposition of the barrier layer include techniques such as high density plasma physical vapor deposition (HDP PVD) or collimated or long throw sputtering. One type of HDP PVD is ionized metal plasma physical vapor deposition (IMP PVD). An example of a chamber capable of IMP PVD of a barrier layer is an IMP VECTRA™ chamber. The chamber and process regime are available from Applied Materials, Inc. of Santa Clara, Calif. Generally, IMP PVD involves ionizing a significant fraction of material sputtered from a metal target to deposit a layer of the sputtered material on a substrate. Power supplied to a coil in the chamber enhances the ionization of the sputtered material. The ionization enables the sputtered material to be attracted in a substantially perpendicular direction to a biased substrate surface and to deposit a layer of material with good step coverage over high aspect ratio features. The chamber may also include a reactive processing gas, such as nitrogen for the deposition of a metal nitride. An exemplary process for the deposition of barrier layers utilizing physical vapor deposition is more fully described in co-pending U.S. patent application Ser. No. 09/650,108, entitled, "Method For Achieving Copper Fill Of High Aspect Ratio Interconnect Features," filed on Aug. 29, 2000, which is incorporated herein by reference to the extent not inconsistent with the invention.

An example of a chamber capable of chemical vapor deposition of a barrier layer is a CVD TxZ™ chamber. The chamber and the process regime is also available from Applied Materials, Inc. of Santa Clara, Calif. Generally, chemical vapor deposition involves flowing a metal precursor into the chamber. The metal precursor chemically reacts to deposit a metal film on the substrate surface. Chemical vapor deposition may further include utilizing a plasma to aid in the deposition of the metal film on the substrate surface. Exemplary processes for the deposition of barrier layers from metal precursors are more fully described in co-pending U.S. patent application Ser. No. 09/505,638, entitled, "Chemical Vapor Deposition of Barriers From Novel Precursors," filed on Feb. 16, 2000, and in co-pending U.S. patent application Ser. No. 09/522,726, entitled, "MOCVD Approach To Deposit Tantalum Nitride Layers," filed on Mar. 10, 2000, both incorporated herein by reference to the extent not inconsistent with the invention. In addition, the PVD chamber and/or the CVD chamber can be integrated into a processing platform, such as an ENDURA™ platform, also available from Applied Materials, Inc. of Santa Clara, Calif.

Deposition of a Seed Layer

The seed layer 22 comprises a conductive metal that aids in subsequent deposition of materials thereover. The seed layer preferably comprises a copper seed layer or alloys thereof. Other metals, particularly noble metals, may also be used for the seed layer. The seed layer may be deposited over the barrier layer by techniques conventionally known in the art including physical vapor deposition techniques and chemical vapor deposition techniques.

Physical vapor deposition techniques suitable for the deposition of the seed layer include techniques such as high density plasma physical vapor deposition (HDP PVD) or collimated or long throw sputtering. One type of HDP PVD is ionized metal plasma physical vapor deposition (IMP PVD). An example of a chamber capable of ionized metal plasma physical vapor deposition of a seed layer is an IMP Vectra™ chamber. The chamber and process regime are available from Applied Materials, Inc. of Santa Clara, Calif. An exemplary process for the deposition of a seed layer utilizing PVD techniques is more fully described in co-pending U.S. patent application Ser. No. 09/650,108, entitled, "Method For Achieving Copper Fill of High Aspect Ratio Interconnect Features," filed on Aug. 29, 2000, which is incorporated herein by reference to the extent not inconsistent with the invention. An example of a chamber capable of chemical vapor deposition of the seed layer is a CVD TxZ™ chamber. The chamber and the process regime are also available from Applied Materials, Inc. of Santa Clara, Calif. An exmplary process for the deposition of a seed layer utilizing CVD techniques is more fully decribed in U.S. Pat. No. 6,171,661 entitled "Deposition of Copper With Increased Adhesion," issued on Jan. 9, 2001.

Deposition of the seed layer by physical vapor deposition techniques is preferred over chemical vapor deposition techniques because of the better adhesion of a PVD seed layer to the barrier layer and lower resistance of the PVD seed layer. It is also believed the PVD seed layer promotes adhesion of the catalytic layer thereon.

Apparatus for Electroless Deposition of a Catalytic Layer and/or a Conductive Material Layer The catalytic layer 24 may be deposited over the seed layer 22, may be deposited on the barrier layer 20, or may be deposited over the substrate structure 10 without the use of a barrier layer. In one embodiment, the catalytic layer may be deposited by electroless deposition. In one embodiment, electroless deposition of the catalytic layer comprises contacting the substrate structure with an aqueous solution comprising 1) noble metal ions, semi-noble metal ions, or combinations thereof, and 2) Group IV metal ions, such as tin (Sn) ions. In another embodiment, electroless deposition of the catalytic layer comprises contacting the substrate structure with an aqueous solution comprising Group IV metal ions, such as tin ions, and then contacting the substrate structure with an aqueous solution comprising noble metal ions, semi-noble metal ions, or combinations thereof.

In one embodiment, the conductive material layer 26, such as a copper layer, may be deposited over the catalytic layer 24 by contacting the substrate structure with an aqueous solution comprising conductive metal ions, such as copper ions, and a reducing agent.

The method of electroless deposition of a catalytic layer and the method of electroless deposition of a conductive material layer may be performed in any chamber adapted to contact a substrate with a processing solution, such as electroless deposition chambers, electroplating chambers, etc. In one embodiment, the catalytic layer and the conductive material layer may be deposited in the same chamber. In another embodiment, the catalytic layer and the conductive material layer are deposited in separate chambers. In one aspect, depositing the catalytic layer and the conductive material layer in separate chambers reduces the generation of particles which may form and deposit on chamber components as a result of the reaction of the catalytic layer solutions and the conductive material layer solutions.

Figure 2:
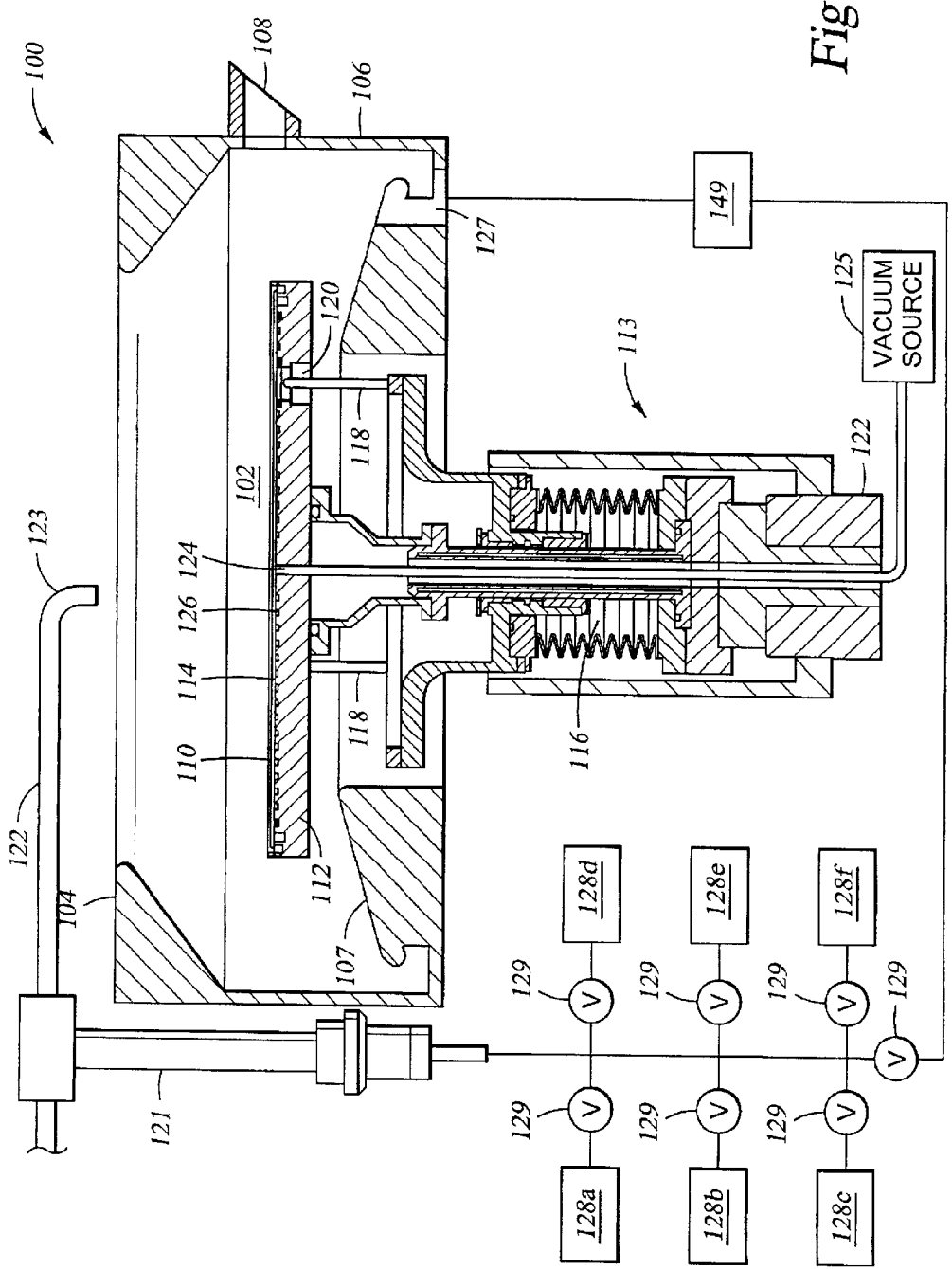
FIG. 2 shows a schematic cross-sectional view of one embodiment of a chamber useful for the deposition of a catalytic layer and/or a conductive material layer.

FIG. 2 shows a schematic cross-sectional view of one embodiment of a chamber 100 useful for the deposition of a catalytic layer and/or a conductive material layer as described herein. Of course, the chamber 100 may also be configured to deposit other types of layers other than the catalytic layer and the conductive material layer.

The chamber 100 includes a processing compartment 102 comprising a top 104, sidewalls 106, and a bottom 107. A substrate support 112 is disposed in a generally central location in the chamber 100. The substrate support 112 includes a substrate receiving surface 114 to receive the substrate 110 in a "face-up" position. In one aspect, having the substrate 110 disposed on the substrate support 112 in a "face-up" position reduces the possibility of bubbles in a fluid when applied to the substrate 110 from affecting the processing of the substrate 110. For example, bubbles may be created in the fluid in-situ, created in the fluid handling equipment, or may be created by transferring of a wet substrate. If the substrate was disposed in a "face-down position" during processing, bubbles in the fluid would be trapped against the surface of the substrate as a result of the buoyancy of the bubbles. Having the substrate in a "face-up" position reduces bubbles in the fluid from being situated against the surface of the substrate since the buoyant forces causes the bubbles to rise up in the fluid. Having the substrate in a face-up position also lessens the complexity of the substrate transfer mechanisms, improves the ability to clean the substrate during processing, and allows the substrate to be transferred in a wet state to minimize contamination and/or oxidation of the substrate.

The substrate support 112 may comprise a ceramic material (such as alumina $A_2O_3$ or silicon carbide (SiC)), TEFLON™ coated metal (such as aluminum or stainless steal), a polymer material, or other suitable materials. TEFLON™ as used herein is a generic name for fluorinated polymers such as Tefzel (ETFE), Halar (ECTFE), PFA, PTFE, FEP, PVDF, etc. Preferably, the substrate support 112 comprises alumina. The substrate support 112 may further comprise embedded heated elements, especially for a substrate support comprising a ceramic material or a polymer material.

The chamber 100 further includes a slot 108 or opening formed through a wall thereof to provide access for a robot (not shown) to deliver and retrieve the substrate 110 to and from the chamber 100. Alternatively, the substrate support 112 may raise the substrate 110 through the top 104 of the processing compartment to provide access to and from the chamber 100.

A lift assembly 116 may be disposed below the substrate support 112 and coupled to lift pins 118 to raise and lower lift pins 118 through apertures 120 in the substrate support 112. The lift pins 118 raise and lower the substrate 110 to and from the substrate receiving surface 114 of the substrate support 112.

A motor 122 may be coupled to the substrate support 112 to rotate the substrate support 112 to spin the substrate 110. In one embodiment, the lift pins 118 may be disposed in a lower position below the substrate support 112 to allow the substrate support 112 to rotate independently of the lift pins 118. In another embodiment, the lift pins 118 may rotate with the substrate support 112.

The substrate support 112 may be heated to heat the substrate 110 to a desired temperature. The substrate receiving surface 114 of the substrate support 112 may be sized to substantially receive the backside of the substrate 110 to provide uniform heating of the substrate 110. Uniform heating of a substrate is an important factor in order to produce consistent processing of substrates, especially for deposition processes having deposition rates that are a function of temperature.

A fluid input, such as a nozzle 123, may be disposed in the chamber 100 to deliver a fluid, such as a chemical processing solution, deionized water, and/or an acid solution, to the surface of the substrate 110. The nozzle 123 may be disposed over the center of the substrate 110 to deliver a fluid to the center of the substrate 110 or may be disposed in any position. The nozzle 123 may be disposed on a dispense arm 122 positioned over the top 104 or through the sidewall 116 of the processing compartment 102. The dispense arm 122 may be moveable about a rotatable support member 121 which is adapted to pivot and swivel the dispense arm 122 and the nozzle 123 to and from the center of the substrate 110. Additionally or alternatively, a nozzle (not shown) may be disposed on the top 104 or sidewalls 106 of the chamber 100 and adapted to spray a fluid in any desired pattern on the substrate 110.

A single or a plurality of fluid sources 128a–f (collectively referred to as "fluid sources") may be coupled to the nozzle 123. Valves 129 may be coupled between the fluid sources 128 and the nozzle 123 to provide a plurality of different types of fluids. Fluid sources 128 may provide, for example and depending on the particular process, deionized water, acid or base solutions, salt solutions, noble metal/Group IV metal solutions (i.e. palladium and tin solutions), semi-noble metal/Group IV metal solutions (i.e. cobalt and tin solutions), noble metal solutions, semi-noble metal solutions, Group IV metal solutions, copper solutions, reducing agent solutions, and combinations thereof. Preferably, the chemical processing solutions are mixed on an as-needed basis for each substrate 110 that is processed. Since chemical processing solutions may be unstable, this point-of-use delivery prevents the solutions from losing their reactivity. Point-of-use delivery also prevents the solutions from prematurely depositing on chamber components and on fluid delivery system components. For example, to dispense a solution containing tin and palladium from fluid source 128a, tin and palladium may be mixed together just prior to being dispensed from fluid source 128a.

The valves 129 may also be adapted to allow a metered amount of fluid to be dispensed to the substrate 110 to minimize chemical waste since some of the chemical processing solutions may be very expensive to purchase and to dispose of. In one embodiment, the fluid path between the fluid sources 128 and the nozzle 123 may be heated in order to deliver a fluid to the substrate surface at a certain temperature.

The chamber 100 further includes a drain 127 in order to collect and expel fluids used in the chamber 100. The bottom 107 of the processing compartment 102 may comprise a sloped surface to aid the flow of fluids used in the chamber 110 towards an annular channel in communication with the drain 127 and to protect the substrate support assembly 113 from contact with fluids. In one embodiment, the drain 127 may be configured to reclaim fluids used in the chamber. For example, the drain 127 may be coupled to a regeneration element 149 such that the fluid, such as an electroless deposition solution, may be recirculated, maintained, and/or chemically refreshed to be reused to process a substrate.

The fluid lines coupled from the fluid sources 128, from the drain 127, and/or to and from the regeneration element 149 may be cleaned and purged with a fluid to reduce particles formed in the fluid lines. For example, the fluid lines may be purged after every wafer, after every other wafer, etc.

In one embodiment, the substrate support 112 may be adapted to rotate. The rotational speed of the substrate support 112 may be varied according to a particular process being performed (e.g. deposition, rinsing, drying.) In the case of deposition, the substrate support 112 may be adapted to rotate at relatively slow speeds, such as between about 10 RPMs and about 500 RPMs, depending on the viscosity of the fluid, to spread the fluid across the surface of the substrate 110 by virtue of the fluid inertia. In the case of rinsing, the substrate support 112 may be adapted to spin at relatively medium speeds, such as between about 100 RPMs and about 500 RPMs. In the case of drying, the substrate support may be adapted to spin at relatively fast speeds, such as between about 500 RPMS and about 2000 RPMs to spin dry the substrate 110. The substrate support 112 may be adapted to spin in alternating directions in a back-and-forth motion to assist in spreading the fluid evenly across the surface of the substrate 110. In one embodiment, the dispense arm 122 is adapted to move during dispensation of the fluid to improve fluid coverage of the substrate 110. Preferably, the substrate support 112 rotates during dispensation of a fluid from the nozzle 123 in order to increase throughput of the system.

The substrate support 112 may include a vacuum port 124 coupled to a vacuum source 125 to supply a vacuum to the backside of the substrate to vacuum chuck the substrate 110 to the substrate support 112. Vacuum Grooves 126 may be formed on the substrate support 112 in communication with the vacuum port 124 to provide a more uniform vacuum pressure across the backside of the substrate 110. In one aspect, the vacuum chuck improves heat transfer between the substrate 110 and the substrate support 112. In addition, the vacuum chuck holds the substrate 110 during rotation of the substrate support 112.

Figure 3A:
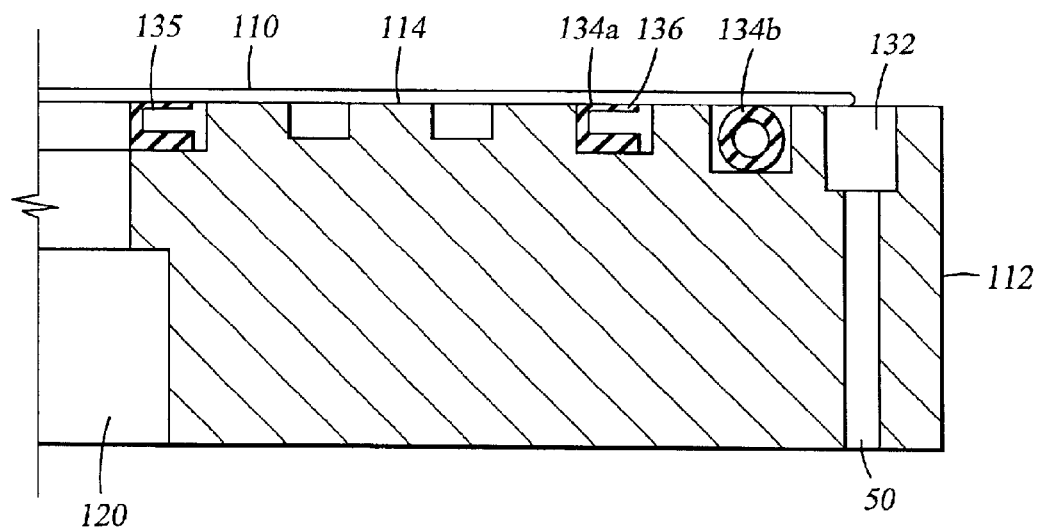
FIGS. 3A–D show a schematic cross-sectional view of one embodiment of the perimeter portion of the substrate support of FIG. 2.

FIG. 3A shows a schematic cross-sectional view of one embodiment of the perimeter portion of the substrate support 112 of FIG. 2. The substrate support 112 may include a fluid drain 132 formed at a perimeter portion of the substrate receiving surface 114 to provide a path for fluids to drain from the top of the substrate 110. The fluid drain 132 may be coupled to a waste port 50 to allow fluid to drain from the substrate support 112. In one embodiment, the fluid drain 132 is formed in the substrate support 112 so that the edge of the substrate will be positioned above the fluid drain 132. At least one elastomeric seal 134a–b may be disposed along the perimeter of the substrate support 112 to prevent the loss of vacuum pressure from the vacuum grooves and/or to prevent fluids from flowing on the backside of the substrate 110. In one embodiment, the elastomeric seal 134a is in the shape of an annular suction cup having a flap 136 which is adapted to be compressed by the substrate 110. Alternatively, the elastomeric seal 134b may be in the shape of an annular tube similar to an o-ring. For example, if two elastomeric seals 134 are used, one of the elastomeric seals 134a may be positioned radially inward on the substrate support 112 to the other elastomeric seal 134b. Another elastomeric seal 135 may also be disposed around the apertures 120 in the substrate support 112 to prevent the loss of vacuum pressure from the vacuum grooves 126 through the apertures 120.

Figure 3B:
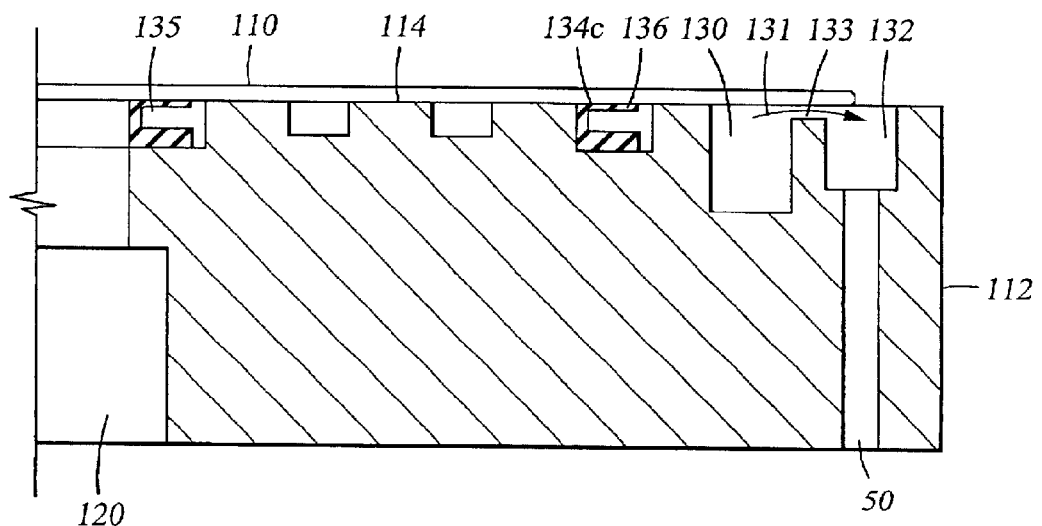

FIG. 3B shows another schematic cross-sectional view of one embodiment of the perimeter portion of the substrate support 112 of FIG. 2. The substrate support 112 may include a gas outlet 130 formed radially inward of the fluid drain 132 to provide a purge gas, such as nitrogen gas or any other gas, to the backside of the perimeter portion of the substrate 110. A gas source or a gas inlet (not shown) is coupled to gas outlet 130 to the purge gas. A channel 133 may be formed in the substrate support 112 to communicate the gas outlet 130 with the fluid drain 132 and to direct the purge gas radially from the gas outlet 130 to the fluid drain 132 as shown by arrow 131. The purge gas prevent fluids from flowing on the backside of the substrate 110 and assists the flow of fluid into the fluid drain 132. The substrate support 112 may further include at least one elastomeric seal 134c disposed on the substrate support 112 radially inward of the gas outlet 130 to prevent the loss of vacuum pressure from the vacuum grooves and/or to prevent fluids from flowing on the backside of the substrate 110.

Figure 3C:
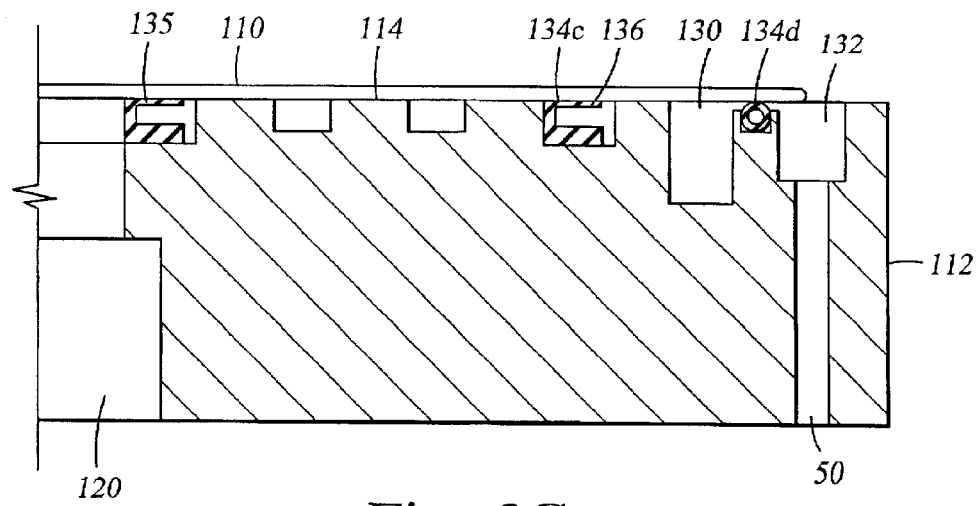

FIG. 3C shows another schematic cross-sectional view of one embodiment of the perimeter portion of the substrate support 112 of FIG. 2. Instead or in conjunction with the channel 133, at least one elastomeric seal 134d may be disposed on the substrate support 112 between the gas outlet 130 and the fluid drain 132. The gas outlet 130 may supply a positive pressure to prevent fluid seepage around elastomeric seal 134d. The gas outlet 130 may provide a blow-off gas to the backside of the perimeter portion of the substrate 110 during transfer of the substrate 110 from the substrate support to prevent fluids from flowing on the backside of the substrate 110. In addition, the gas outlet 130 may also provide a vacuum pressure during processing to better vacuum chuck the perimeter portion of the substrate 110.

Figure 3D:
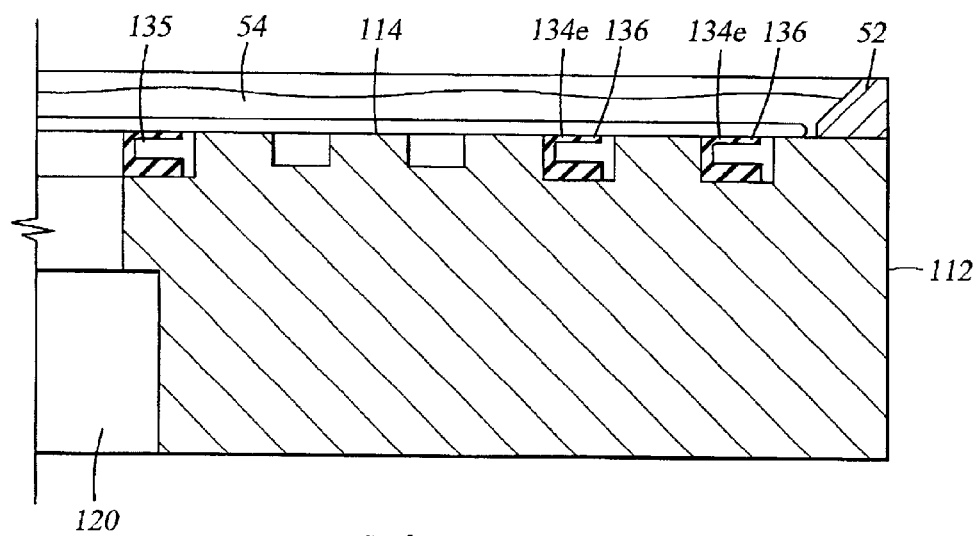

FIG. 3D shows another schematic cross-sectional view of one embodiment of the perimeter portion of the substrate support 112 of FIG. 2. The substrate support 112 may include at least one elastomeric seal 134e formed at a perimeter portion of the substrate receiving surface 114 to prevent the loss of vacuum pressure from the vacuum grooves and/or to prevent fluids from flowing on the backside of the substrate 110. The substrate support 112 may further include a lip 52 so that a processing fluid 54 may collect on the substrate 110 and the substrate support 112. In one embodiment, the substrate support 112 may be adapted to rotate to remove the processing fluid 54 collected on the substrate 110 and the substrate support 112 through inertia of the processing fluid 54.

These "fluid seals" as shown and described in FIGS. 3A–3D prevents chemical processing solutions from depositing on the backside of the substrate 110. In addition, if pulled through the vacuum grooves 126 and into the vacuum port 124, fluids and chemical processing solutions may damage or block the vacuum source.

Figure 4:
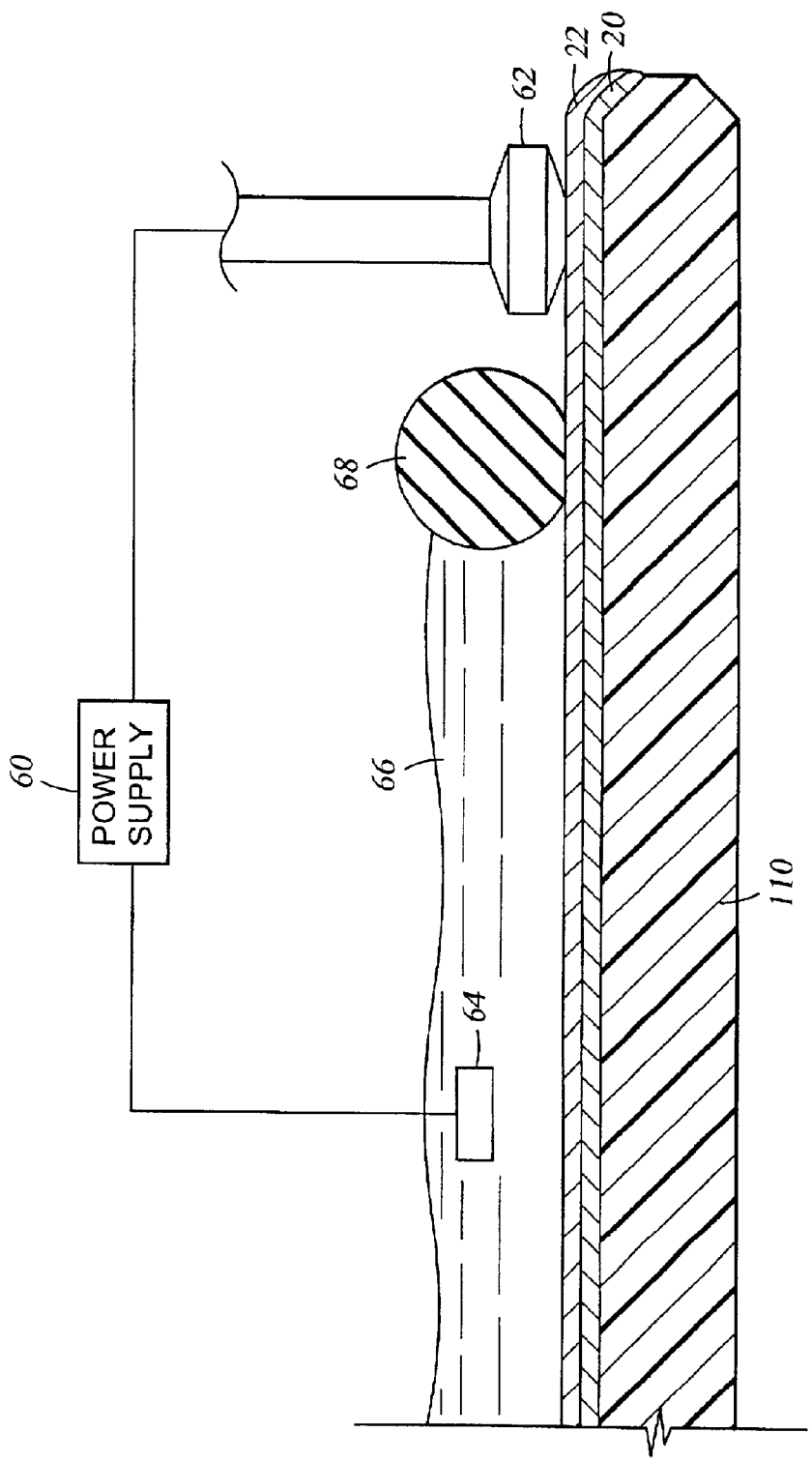
FIG. 4 shows a schematic diagram of a power supply connected to a conductive portion of a substrate.

The chamber may further include a power supply coupled to the substrate to provide a bias thereto. FIG. 4 shows a schematic diagram of one embodiment of a power supply 60 connected to a conductive portion of a substrate 110 to provide a bias to the substrate. One pole of a power supply 60 is coupled to the substrate (i.e. to a conductive copper seed 22 layer) by an electrical contact 62. The electrical contact 62 may be a contact ring as more fully described in U.S. patent application Ser. No. 09/289,074, entitled "Electro-Chemical Deposition System," filed on Apr. 8, 1999, which is incorporated by reference in its entirety. The other pole of the power supply 60 is coupled to an electrode 64 adapted to be contact with a fluid 66 on the substrate 110. A fluid seal 68 may be disposed in contact with the substrate 110 to isolate the electrical contact 62 from the electrode 64.

Figure 5:
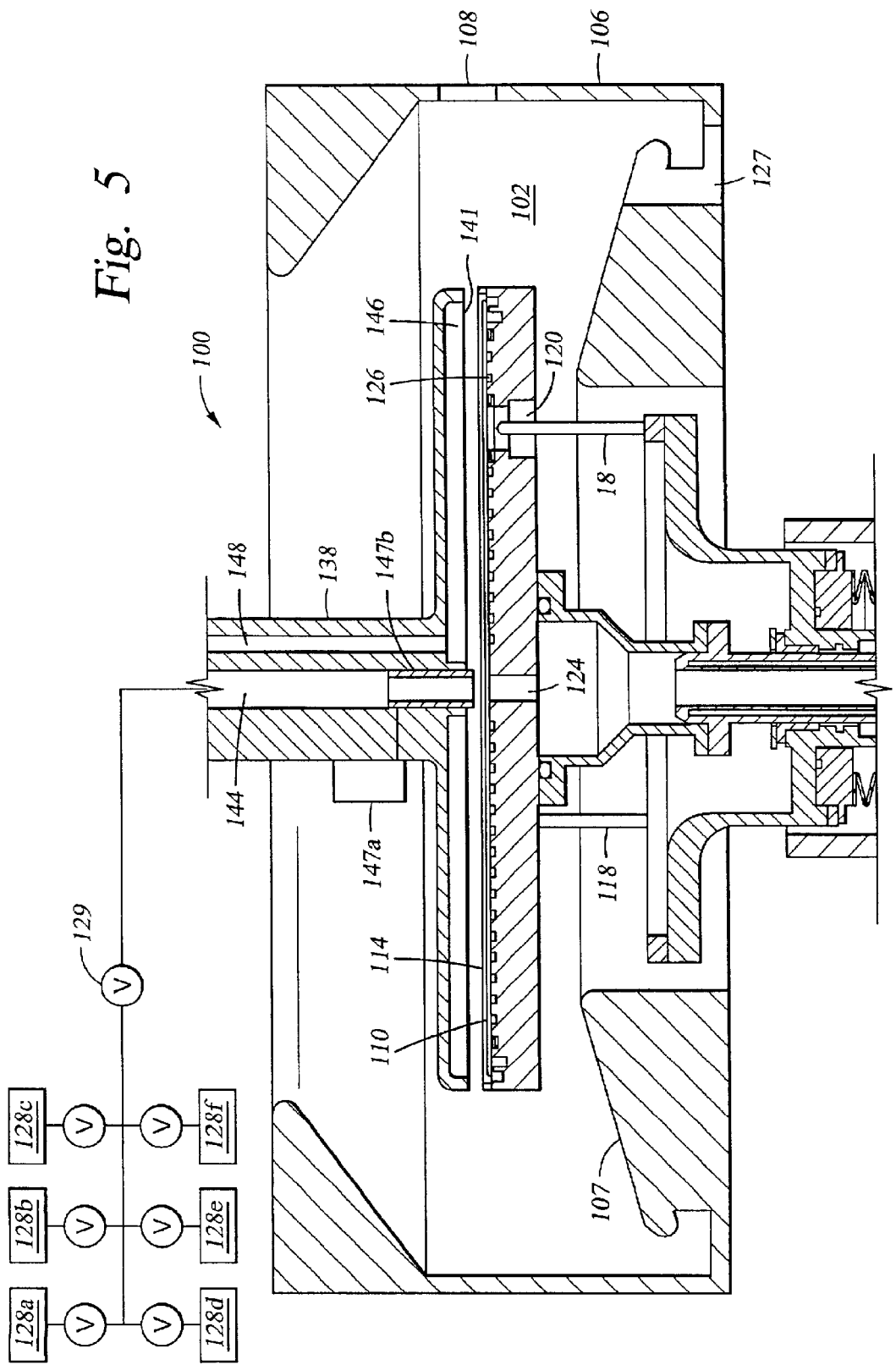
FIG. 5 shows a schematic cross-sectional view of another embodiment of a chamber useful for the deposition of a catalytic layer and/or a conductive material layer.

FIG. 5 shows another embodiment of the chamber 100 of FIG. 2 further comprising an evaporation shield 138 adapted to be disposed over the substrate 110 on the substrate receiving surface 114 and sized to cover the substrate 110 in order to prevent the evaporation of a fluid, such as a chemical processing solution, dispensed on the substrate 110. In one embodiment, if the catalytic layer and the conductive material layer are deposited in separate chambers, the chamber for electroless deposition of the catalytic layer may not have an evaporation shield while the chamber for electroless deposition of the conductive material layer does have an evaporation shield. For the electroless deposition of some catalytic layers, because deposition occurs at a relatively low temperature and for a relatively short period and because the deposited layer may be relatively thin, evaporation of the fluid layer may not adversely affect the deposition of the catalytic layer. However in another embodiment, if the catalytic layer and the conductive material layer are deposited in separate chambers, the chamber for electroless deposition of the catalytic layer and the chamber for electroless deposition of the conductive material layer both have an evaporation shield.

In one embodiment, the evaporation shield 138 and/or the substrate support 112 may be adapted to move up and down to allow the substrate 110 to be transferred to and from the substrate receiving surface 114. In one embodiment, a fluid input, such as a fluid port 144, in the evaporation shield may be coupled to a single or a plurality of fluid sources 128 to provide a plurality of different types of fluids. Valves 129 may be coupled between the fluid sources 128 and the fluid port 144 to provide a plurality of different types of fluids. Preferably, the chemical processing solutions are mixed or prepared on an as-needed basis for each substrate 110 that is processed. Since chemical processing solutions may be unstable, this point-of-use delivery prevents the solutions from losing their reactivity. Point-of-use delivery also prevents the solutions from prematurely depositing on chamber components and on fluid delivery system components. The valves 129 may also be adapted so that a metered amount of fluid is dispensed to the substrate 110 to minimize chemical waste since some of the chemical processing solutions may be very expensive to purchase and to dispose of. In one embodiment, the fluid path between the fluid sources 128 and the fluid port 144 may be heated in order to deliver a fluid to the substrate surface at a certain temperature.

In one embodiment, the evaporation shield 138 may be heated to heat a fluid on the substrate 110 alone or in conjunction with a heated substrate support 112. The evaporation shield 138 may be heated with embedded heating elements within the evaporation shield 138. Alternatively, the evaporation shield may be heated by circulating a heated fluid in contact with the evaporation shield. Alternatively, the evaporation shield 138 may be heated with heat lamps.

In one embodiment, the evaporation shield 138 may comprise a material selected from the group including polymers (such as polyethylene or polyvinylidene fluoride), ceramics (such as alumina), quartz, and coated metals (such as a TEFLON™ coated metal). When the evaporation shield 138 includes a degassing membrane as discussed below, the evaporation shield 138 preferably comprises a polymer.

Figure 6:
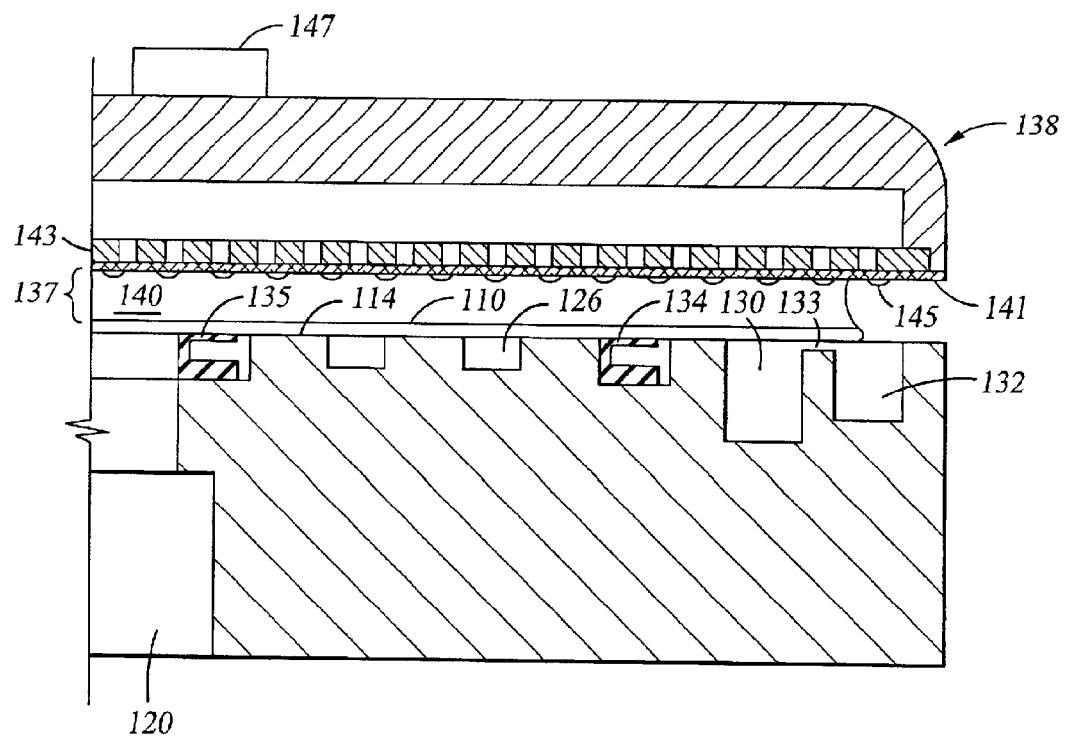
FIG. 6 shows a schematic cross-sectional view of one embodiment of the perimeter portion of the substrate support of FIG. 5.

FIG. 6 shows one embodiment of the evaporation shield 138 at a perimeter portion of the substrate support 112. The evaporation shield 138 may be positioned from the substrate 110 so that there is a gap 137 between the bottom of the evaporation shield 138 and the substrate 110. In one embodiment, a fluid may be dispensed on the substrate 110 to form a fluid layer 140 in the gap 137 with a bottom of the fluid layer 140 contacting the substrate 110 and a top of the fluid layer 140 contacting the evaporation shield 138. If the evaporation shield 138 is positioned too far away from the substrate receiving surface 114, the fluid layer 140 cannot contact the bottom of the evaporation shield 138 and condensation of the fluid may occur on the evaporation shield 138. In addition, if the evaporation shield 138 is positioned too far away from the substrate receiving surface 114, the fluid position may not be controllable between the substrate 110 and the evaporation shield 138. Condensation on the evaporation shield 138 may cause dripping of fluid from the evaporation shield 138 which may cause splashing of the fluid on the substrate 110 and which may affect the uniformity of the processing on the surface of the substrate 110. In one embodiment, the evaporation shield 138 is positioned over the substrate 110 so that the size of the gap is between about 0.5 millimeters to about 4 millimeters. Therefore, for a substrate 110 having a 300 mm diameter, the volume of the fluid layer 140 (area of the substrate×thickness of the gap) is about 35 ml to about 285 ml. Similarly, for a substrate 110 having a 200 mm diameter, the volume of the fluid layer 140 is about 15 ml and about 130 ml. In another embodiment, the bottom of the evaporation shield 138 is positioned substantially parallel to the substrate 110 disposed on the substrate receiving surface 114 to provide a substantially uniform thickness of the fluid layer 140 over the substrate 110. In one embodiment, the evaporation shield 138 and/or the substrate support 112 may be adapted to move up and down to adjust the size of the gap 137 between the evaporation shield 138 and the substrate support 112. In one embodiment, the fluid port 144 or a drain may be adapted to remove or pull back the fluid on the substrate 110 in order to reuse the fluid for processing of other substrates or to dispose of the fluid. For example, fluid port 144 may be coupled to a regeneration element 149 such that the fluid, such as an electroless deposition solution, may be recirculated, maintained, and/or chemically refreshed to be reused to process a substrate.

The evaporation shield 138 may further comprise a degassing membrane 141 as the bottom surface of the evaporation shield 138 which is adapted to be in contact with the fluid layer 140. The degassing membrane comprises a breathable material which allows the passage of air but not fluid therethrough. One example of a breathable material is a hydrophobic breathable polymer film. As a consequence, gas (such as dissolved hydrogen generated during electroless deposition of copper or trapped air bubbles) in the fluid layer 140 may be removed by exchange of the gas through the degassing membrane 141. In one embodiment, the degassing membrane is disposed on a membrane support 143 on the bottom of the evaporation shield 138. The membrane support 143 may comprise a porous polymer support. In one aspect, an anneal (as further discussed below) of the catalytic layer and/or the electroless deposited conductive layer is not needed because the degassing membrane 141 of the evaporation shield removes enough gas in the fluid layer 140. The evaporation shield 138 may further comprise a plenum 146 (shown in FIG. 5) formed therein to allow the passage of gas from the fluid layer 140 through the degassing membrane 141 and into the evaporation shield 138. In one aspect, a vacuum pressure or a controlled low partial pressure of defined gases may be provided to the plenum 146 by a plenum port 148 (shown in FIG. 5) of the evaporation shield 138 to promote the exchange of gases in the fluid layer 140 through the degassing membrane 141.

Figure 7:
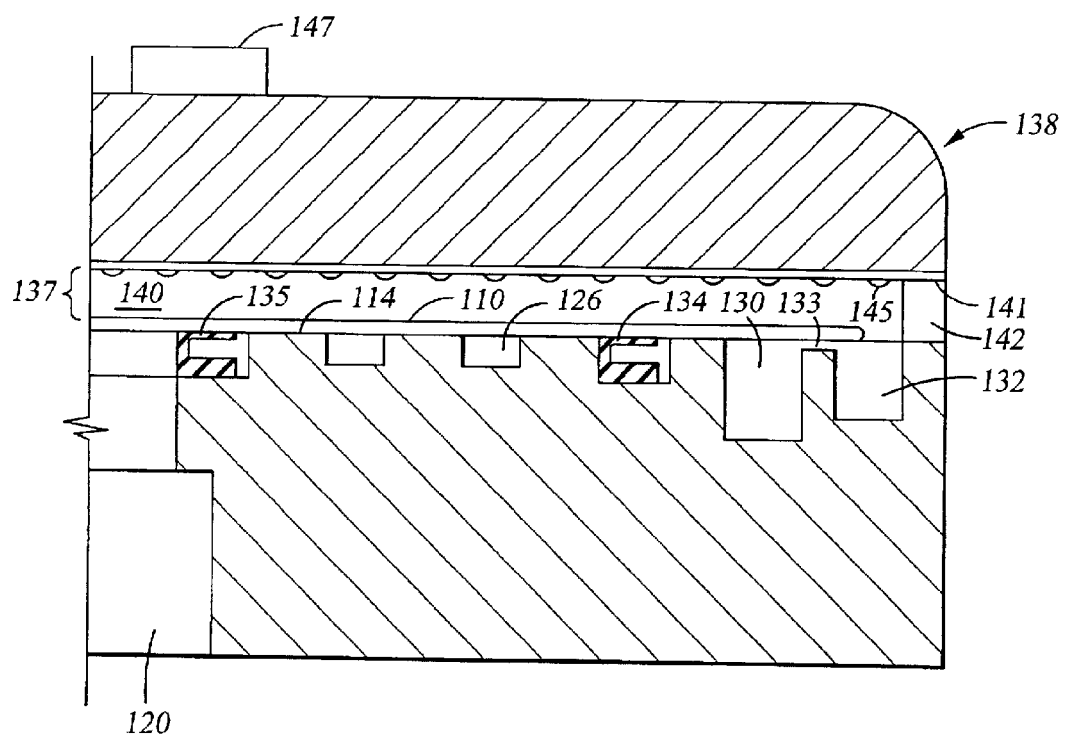
FIG. 7 shows a schematic cross-sectional view of another embodiment of the perimeter portion of the substrate support of FIG. 5.

FIG. 7 shows another embodiment of the evaporation shield 138 used with a seal 142. The seal 142 may be coupled to a perimeter portion of the evaporation shield 138 and/or may be coupled to a perimeter portion on the substrate support 112. The seal 142 is sized so that it maintains the gap 137 between the evaporation shield 138 and the substrate 110 on the substrate receiving surface 114. The seal 138 may also further prevent evaporation of a fluid dispensed on the substrate 110.

In one embodiment, the evaporation shield 138 may rotate to dry itself. In another embodiment, the evaporation shield 138 and/or the substrate support 112 may rotate to mix the fluid layer 140 between the evaporation shield 138 and the substrate 112. For example, to mix the fluid layer 140, the evaporation shield 138 can be stationary while the substrate support 112 rotates; the evaporation shield 138 can rotate while the substrate support 112 is stationary; and/or the evaporation shield 138 and the substrate support 112 can rotate in the same or opposite directions. In one embodiment, the evaporation shield 138 and the substrate support 112 rotate together in alternating directions in a back and forth motion in which the change in momentum aids in mixing the fluid layer 140. If the evaporation shield 138 and the substrate support 112 further includes the seal 142, the evaporation shield 138 and the substrate support 112 preferably rotate together to mix the fluid layer 140 in order to prevent surfaces of the evaporation shield 138 and/or the substrate support 112 from rubbing against the seal 142 and generating particles.

The bottom surface of the evaporation shield 138 may further include fluid agitation components 145, such as channels, veins or protrusions (FIGS. 6 and 7) to aid in mixing of the fluid layer 140. The channels, veins, or protrusions may be formed in any pattern, such as radially or as an array on the bottom surface of the evaporation shield 138. The evaporation shield 138 may further include a transducer 147 (FIGS. 6 and 7) adapted to provide acoustic waves, such as acoustic waves between low kilohertz frequencies up to megasonic frequencies, to the fluid layer 140 disposed on the substrate 110 in order to aid in agitation of the fluid layer 140. The transducer 147 may be disposed against the evaporation shield 138 so that the acoustic waves are coupled through the evaporation shield 138 to the fluid layer. Alternatively, the transducer 147a (FIG. 5) may comprise a rod 147b (FIG. 5) which is adapted to contact the fluid layer to provide the acoustic waves. For example, the transducer may comprise a hollow rod provided at the fluid port of the evaporation shield 138 which extends into the fluid layer 140 to provide acoustic waves to the fluid layer 140. In one embodiment, a transducer which provides low kilohertz frequencies is used in order to prevent cavitation of bubbles in the fluid layer 140. Cavitation of the bubbles in the fluid layer 140 may have a detrimental effect to the processing of the substrate and are therefore undesirable. A transducer (not shown) may also be coupled to the substrate support 112.

Figure 8:
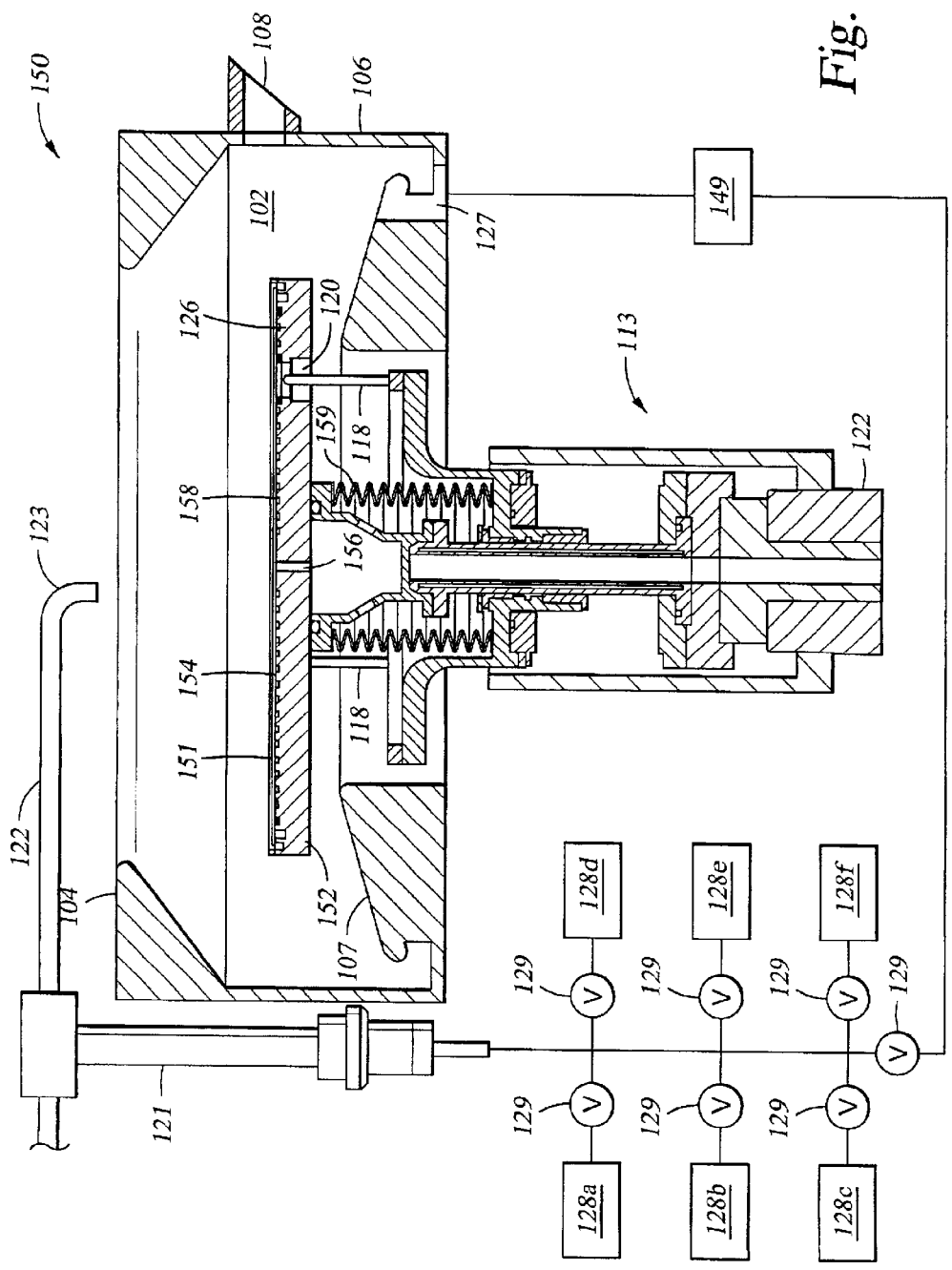
FIG. 8 shows a schematic cross-sectional view of still another embodiment of a chamber useful for the deposition of a catalytic layer and/or a conductive material layer.

FIG. 8 shows a schematic cross-sectional view of one embodiment of a chamber 150 useful for the electroless deposition of a catalytic layer and/or a conductive material layer. Some components of the chamber 150 are the same or similar to those described with reference to the chamber 100, described above. Accordingly, like numbers have been used where appropriate. The chamber 150 comprises a substrate support 152 having a substrate receiving surface 154 adapted to receive a substrate 151 in a face-up position. The substrate support further includes a vacuum port 156 in communication with a bellows 159 to supply a vacuum to the backside of the substrate to vacuum chuck the substrate 151 to the substrate support 152. Vacuum Grooves 158 may be formed on the substrate support 152 in communication with the vacuum port 156 to provide a more uniform vacuum pressure across the backside of the substrate 151. When the bellows 159 expands, a vacuum is created to chuck the substrate 151 to the substrate support 152. When the bellows 159 contracts, the vacuum is released and the substrate 151 may be removed from the substrate support 152. In one aspect, the substrate support 152 does not need a gas outlet and a fluid drain, such as those shown in FIG. 3, because some fluid may enter the bellows 159 without damage to the simple mechanism of the bellows 159 and because only a fixed amount of fluid may enter the bellows 159.

Figure 9:
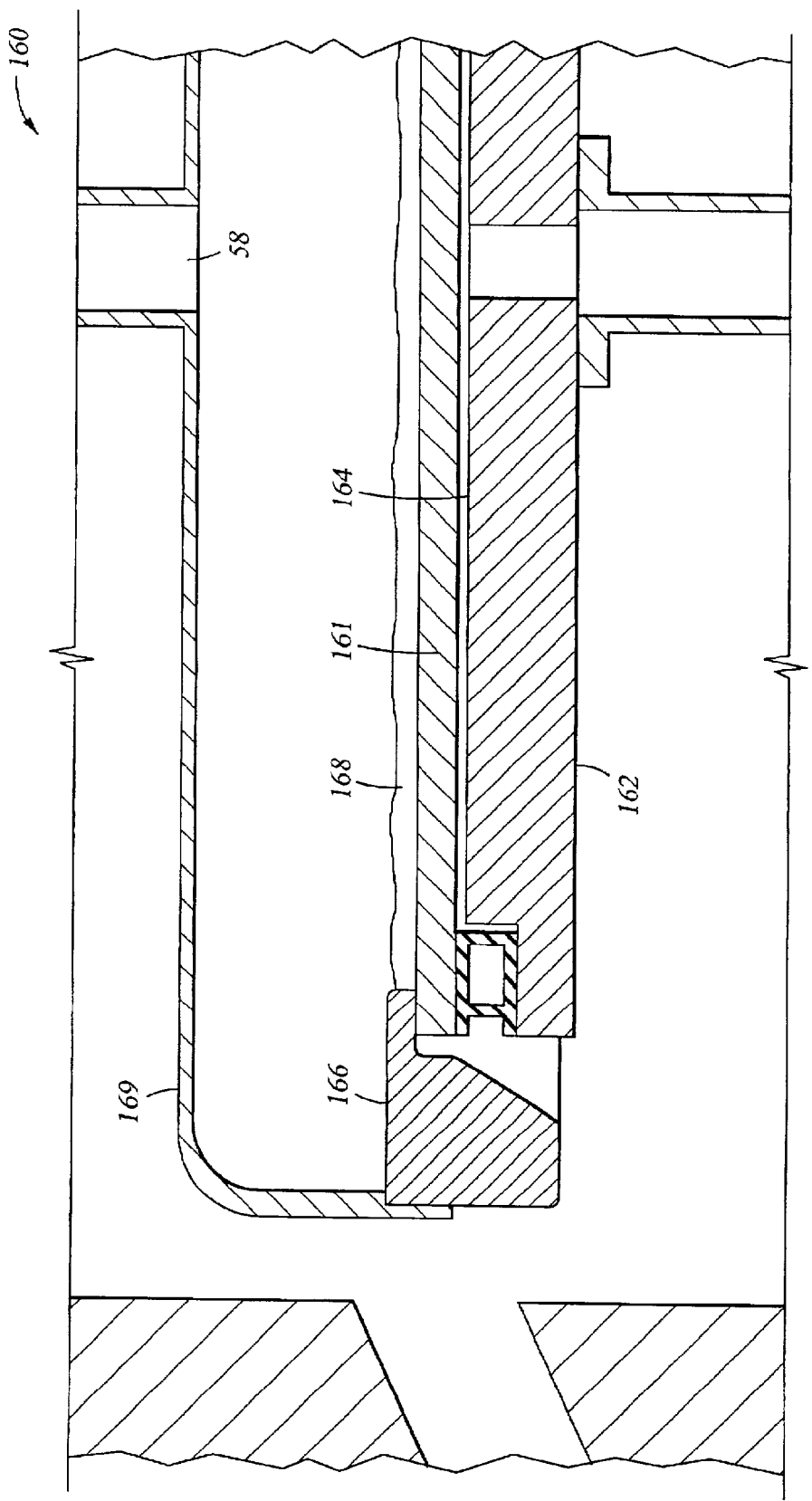
FIG. 9 shows a schematic cross-sectional view of yet another embodiment of a chamber useful for the deposition of a catalytic layer and/or a conductive material layer.

FIG. 9 shows a schematic cross-sectional view of another embodiment of a chamber 160 useful for the electroless deposition of a catalytic layer and/or a conductive material layer. The chamber 160 comprises a substrate support 162 having a substrate receiving surface 164 adapted to receive a substrate 161 in a face-up position. The chamber 160 further comprises a clamp ring 166 to hold the substrate 161 against the substrate support 162. In one aspect, the clamp ring 166 improves the heat transfer between substrate 161 and the heated substrate support 162. In another aspect, the clamp ring 166 holds the substrate during rotation of the substrate support 162. In still another aspect, the thickness of the clamp ring 166 is used to form a puddle 168 of fluid on the surface of the substrate 162 during processing. The chamber 160 may further include a movable cover 169 which is adapted to be positioned on top of the clamp ring to minimize evaporation of a fluid dispensed on the substrate 161. A fluid input 58 may be coupled to the movable cover 169 to provide a fluid to the substrate 161. The fluid input 58 is adapted to have a small orifice in order to reduce evaporation of the puddle 168.

Figure 10:
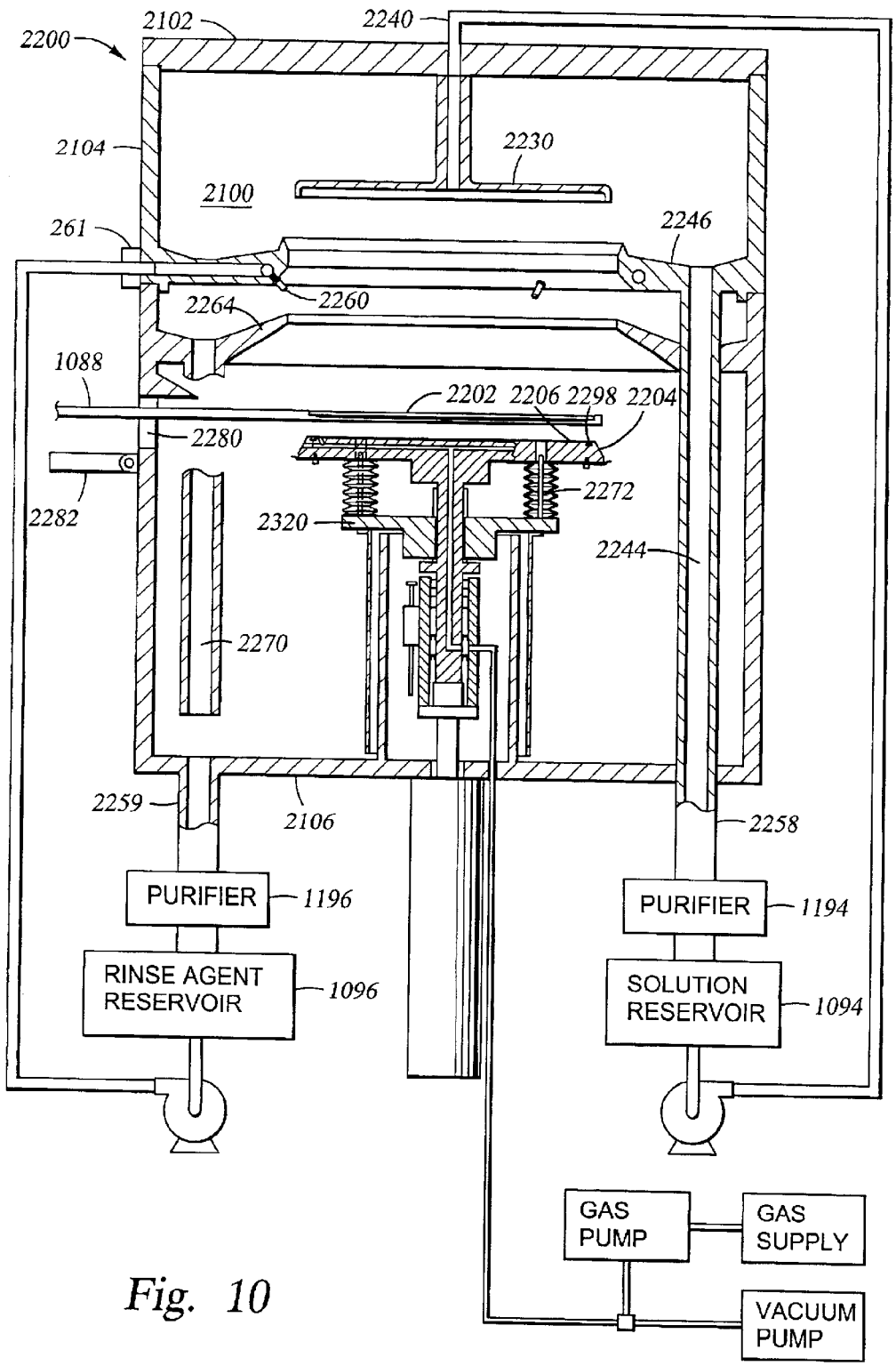
FIG. 10 shows a cross-sectional view of one embodiment of a multilevel chamber useful for the deposition of a catalytic layer and/or a conductive material layer.

In one embodiment, the electroless deposition chambers of FIGS. 2–9 may be adapted to be multilevel chambers to aid in reclaiming fluids used during processing. FIG. 10 shows a cross-sectional view of one embodiment of a multilevel chamber 2200. Generally, the multilevel chamber 2200 comprises a substrate support member 2204 and a solution inlet 2240 supplying a solution into the multilevel chamber 2200 above the substrate 2202 or in the direction of the substrate surface to be processed. The multilevel chamber 2200 defines a cell enclosure 2100 and comprises an enclosure lid 2102, an enclosure side wall 2104 and an enclosure bottom 2106. The enclosure side wall 2104 includes a opening 2280 for transfer of substrates into and out of the multilevel chamber 2200, and a gate valve 2282 for sealing the opening 2280. The multilevel chamber 2200 may optionally include an evaporation shield or cover 2230 disposed at a top portion of the multilevel chamber 2200. The evaporation shield/cover 2230 may be adapted to rotate.

In operation, a substrate 2202 is transferred into the multilevel chamber 2200 by a robot blade 1088 through the opening 2280 over the substrate support member 2204 that is retracted. The substrate 2202 is positioned above the substrate support member 2204, and a lift pin platform 2320 is elevated. The substrate 2202 is lifted above the robot blade 1088 by lift pins 2272 on the lift pin platform 2320. The robot blade 1088 then retracts out of the multilevel chamber 2200 and the gate valve 2282 closes to seal the processing environment. The lift pin platform 2320 lowers the lift pins 2272 to position the substrate 2202 onto the substrate supporting surface 2206. A vacuum chuck holds the substrate 2202 on the substrate supporting surface 2206, and the fluid seal 2298 seals the backside of the substrate 2202 from the processing chemicals. A vacuum pump and/or a gas pump/supply may be coupled to the substrate support member 2204. For example, the vacuum pump may supply a vacuum to vacuum chuck the substrate 2202 to the substrate support member 2204. Further, for example, the gas pump/supply may supply a purge gas to a peripheral portion of the substrate 2202.

The support member 2204 is then elevated by a motor to a processing position in which the substrate 2202 is positioned above a catch-up cup 2246. In one embodiment, the substrate 2202 is positioned proximate the evaporation shield/cover 2230. Alternatively or additionally, the evaporation shield/cover 2230 may be adapted to move to and away from the substrate. The catch cup 2246 is a structure extending inwardly from the enclosure side wall 2104 of the multilevel chamber 2200. At the processing position, a solution is pumped through the solution inlet 2240 at the enclosure top 2102 and onto the substrate surface. After the solution flows over the substrate surface, the catch cup 2246 is adapted to collect the solution. The solution then flows through a fluid drain 2244 and is pumped out of the multilevel chamber 2200 through outlet 2258. The solution may be reclaimed into the electrolyte reservoir 1094 and recirculated to the solution inlet 2240. The solution may also be dumped.

After processing, the substrate 2202 may be lowered to a rinsing position below a horizontal plane defined by one or more rinse spray spouts 2260 but above a horizontal plane defined by the tip of the rinse catch cup 2264. The rinse spray spouts 2260 spray a rinse agent over the substrate 2202. The rinse agent is drained through the rinse drain 2270 to the bottom of the cell 2200 and pumped out of the cell 2200 through outlet 2259 into a rinse agent reservoir 1096. Optionally, the substrate support member 2204 may rotate to spin dry the substrate 2202. Purifiers 1194, 1196 may be coupled to the outlets 2258 and 2259 to collect or recycle the costly components (e.g. Pd, Sn, etc.) or environmentally unfriendly components (e.g. metals, complexing agents, etc.).

A shutter plate (not shown) may be positioned to isolate certain regions of the multilevel chamber 2220. For example, a shutter plate may be positioned below the evaporation shield/cover 2230 to control the dripping of residual solution from the evaporation shield/cover 2230 onto the substrate 2202. In another example, a shutter plate may be positioned above the catch cup 2246 to prevent a rinsing agent from rinse spouts 2260 from splashing into the catch cup 2246. Alternatively, the evaporation shield/cover 2230 may be adapted to move out of the way to prevent dripping from the evaporation shield/cover 2230 onto the substrate 2202. An exemplary multilevel chamber is more fully described in co-pending U.S. patent application Ser. No. 09/294,240, entitled, "Electro-Chemical Deposition Cell For Face-Up Processing Of Single Semiconductor Substrates," filed Apr. 19, 1999, which is incorporated herein by reference to the extent not inconsistent with the invention.

Figure 11:
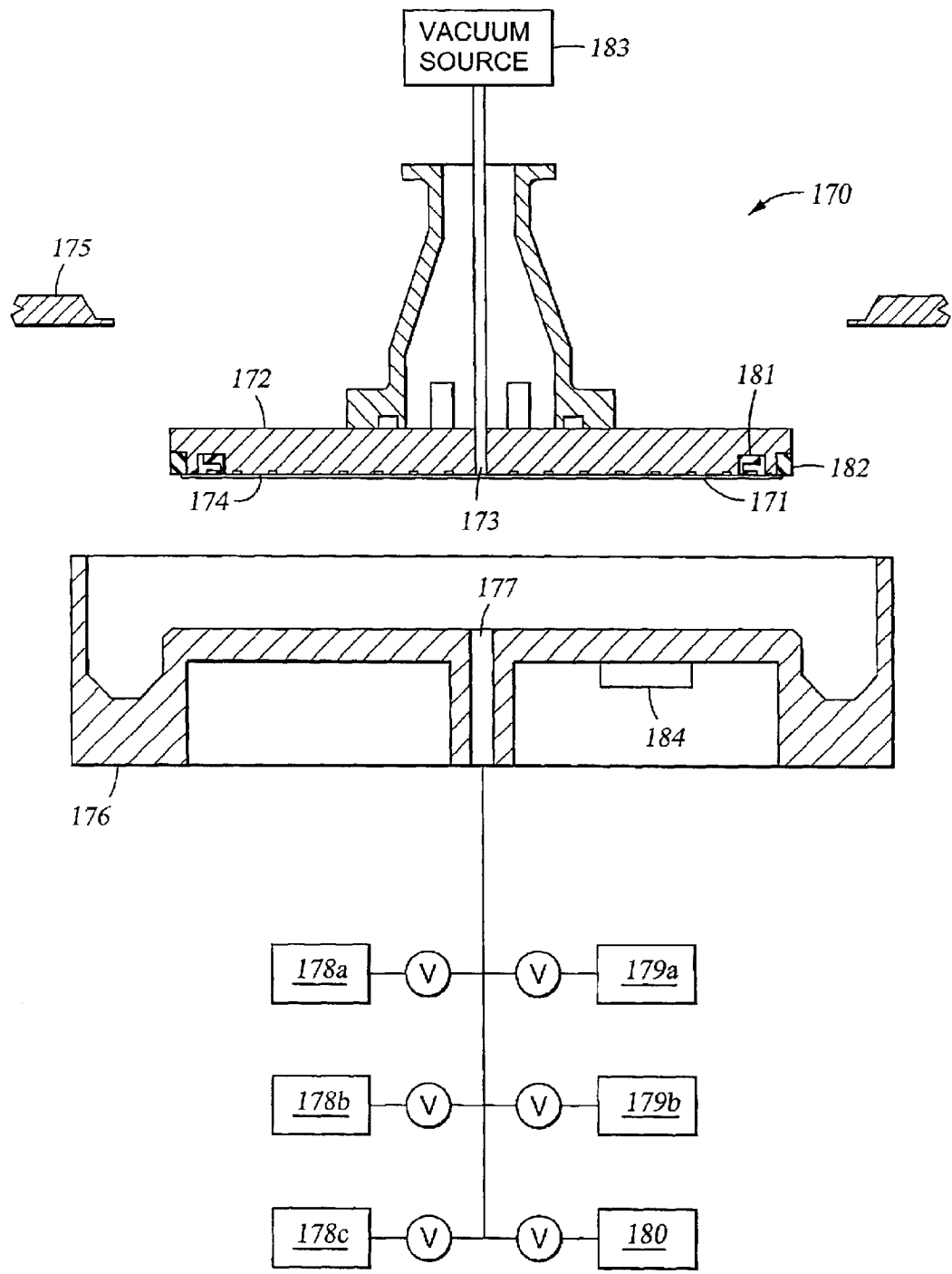
FIG. 11 shows a schematic cross-sectional view of another embodiment of a chamber useful for the deposition of a catalytic layer and/or a conductive material layer.

FIG. 11 shows a schematic cross-sectional view of another embodiment of a chamber 170 useful for the deposition of a catalytic layer and/or a conductive material layer. The chamber 170 comprises a substrate holder 172 having a substrate receiving surface 174 adapted to hold a substrate 171 in a face-down position. The substrate holder 172 may be heated to heat the substrate 171 to a desired temperature. The substrate receiving surface 174 of the substrate holder 172 may be sized to substantially receive the backside of the substrate 171 to provide uniform heating of the substrate 171. The substrate holder 172 further includes a vacuum port 173 coupled to a vacuum source 183 to supply a vacuum to the backside of the substrate 171 to vacuum chuck the substrate 171 to the substrate holder 172. The substrate holder 172 may further include a vacuum seal 181 and a liquid seal 182 to prevent the flow of fluid against the backside of the substrate 171 and into the vacuum port 173. The chamber 170 further comprises a bowl 176 having a fluid input, such as a fluid port 177. The fluid port 177 may be coupled to a fluid source 178a–c, a fluid return 179a–b, and/or a gas source 180.

The substrate holder 172 may further be coupled to a substrate holder assembly adapted to raise and lower the substrate holder 172. In one embodiment, the substrate holder assembly may be adapted to immerse the substrate 171 into a puddle or a bath. In another embodiment, the substrate assembly may be adapted to provide a gap between the substrate 171 and the bowl 176. The fluid source 178 is adapted to provide a fluid through the fluid port 177 to fill the gap between the substrate 171 and the bowl 176 with a fluid layer. The substrate assembly may be adapted to rotate the substrate holder 176 to provide agitation of the fluid layer. The substrate holder 172 and/or the bowl 176 may further comprise a transducer 184 to provide to acoustic waves, such as acoustic waves at ultrasonic frequencies and megasonic frequencies, to the fluid layer disposed on the substrate 171 in order to aid in agitation of the fluid layer. The substrate holder 172 may further be adapted to vibrate to aid in agitation of the fluid layer. In one aspect, agitation of the fluid layer prevents gas bubbles trapped in the fluid layer or generated in processing from affecting processing and deposition. For example, agitation of the fluid layer dislodges gas bubbles residing of the surface of the substrate 171.

The bowl may further comprise a heater to heat the fluid layer to a desired temperature. After processing with the fluid layer is complete, the fluid return 179 is adapted to pull the fluid back through a drain or the fluid port 177 in order to reclaim the fluid for reuse in processing other substrates. The gas source 180 is adapted to provide a gas, such as nitrogen, to flow a gas to the surface of the substrate 171. The substrate holder assembly may be further adapted to rotate the substrate holder 172 to spin dry the substrate 171. The chamber 170 may further comprise a retractable hoop 175 adapted to hold the substrate 171 for transfer from and to the chamber 170. For example, the retractable hoop may comprise two partial-rings (i.e. each shaped as a "c"). The rings may be moved together to receive a substrate 171. The rings may be move apart to allow the substrate holder 172 to be lowered proximate the bowl 176.

Figure 12:
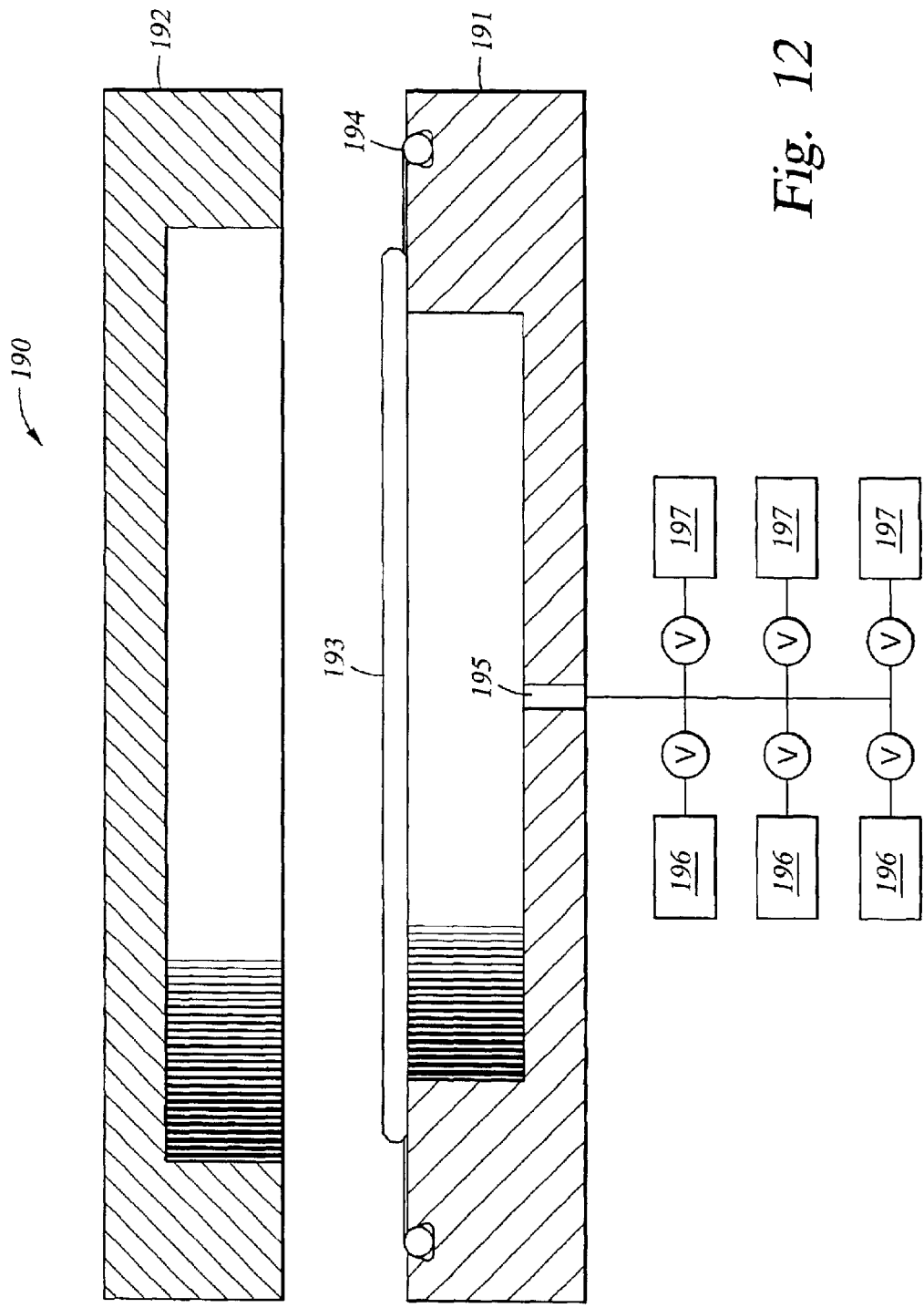
FIG. 12 shows a schematic cross-sectional view of another embodiment of a chamber useful for the deposition of a catalytic layer and/or a conductive material layer.

FIG. 12 shows a schematic cross-sectional view of another embodiment of a chamber 190 useful for the deposition of a catalytic layer and/or a conductive material layer. The chamber 190 comprises a lower bowl 191 and an upper bowl 192. The lower bowl 191 is adapted to hold a substrate 193 in a face-up or a face down-position. The upper bowl 192 is adapted to move up and down for transfer of the substrate 193 from and to the chamber 190. The upper bowl 192 is further adapted to move to contact the lower bowl 191. A seal 194 is disposed between the upper bowl 192 and the lower bowl 191 to provide a liquid seal therebetween. The lower bowl 191 further comprises a fluid input, such as a fluid port 195, coupled to a fluid supply 196 and a fluid return 197. The fluid supply 196 is adapted to supply a fluid to the lower bowl 191. In one embodiment, the fluid is adapted to fill the lower bowl 191 and the upper bowl 192. The lower bowl 191 and/or the upper bowl 192 may be heated. After processing with the fluid layer is complete, the fluid return 197 is adapted to pull the fluid back through a drain or the fluid port 195 in order to reclaim the fluid for reuse in processing other substrates. In one embodiment, the chamber 190 may be designed without having a chucking mechanism. Chamber 190 may be used to advantage for electroless deposition of a copper conductive layer because copper electroless deposition will primarily occur only on a catalytic layer or metal surfaces.

The chambers of FIGS. 2–12 may be adapted for the processing of 200 mm substrates, 300 mm substrates, or any sized substrates. The chambers have been shown for single-substrate processing. However, the chambers may be adapted for batch processing. The chambers may be adapted for single use of fluid or may be adapted to recirculate fluids which are reused for a number of substrates and then dumped. For example, in one embodiment, a chamber adapted to recirculate fluids comprises a drain which selectively diverts certain fluids to be reused during processing. If the chamber is adapted to recirculate fluids, the fluid lines should be rinsed in order to prevent deposition in and clogging of the lines. Although the embodiments of the chambers have been described with certain elements and features, it is understood that a chamber may have a combination of elements and features from the different embodiments.

The process of depositing the catalytic layer and/or the conductive material layer may include annealing the substrate in a thermal anneal chamber. Thermal anneal process chambers are generally well known in the art, and rapid thermal anneal chambers are typically utilized in substrate processing systems to enhance the properties of the deposited materials. The invention contemplates utilizing a variety of thermal anneal chamber designs, including hot plate designs, heat lamp designs, and furnace designs, to enhance the electroless deposition results. One particular furnace design involves the use of a heated gas in a hot zone of a furnace chamber to anneal the substrate. The furnace chamber further comprises a cold zone. The substrate is transferred to the furnace chamber by placing the substrate on lift pins in the cold zone of the furnace chamber. The substrate is then raised into the hot zone by the lift pins to anneal the substrate. Then, the substrate is lowered back into the cold zone to allow the substrate to cool.

Figure 13:
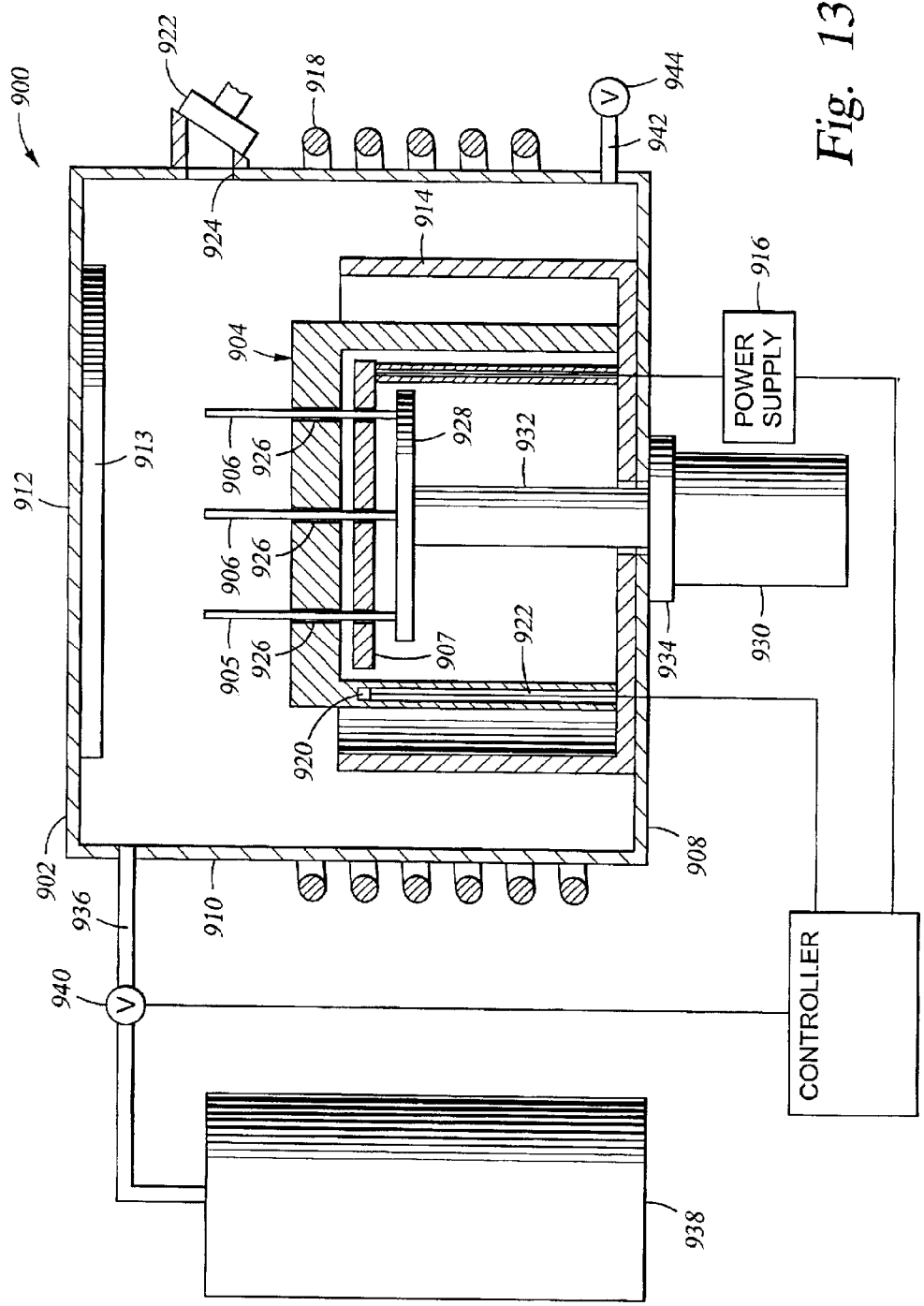
FIG. 13 shows a schematic cross-sectional view of one embodiment of a rapid thermal anneal chamber.

One particular thermal anneal chamber useful for the present invention are the xZ™ chambers available from Applied Materials, Inc., located in Santa Clara, Calif. FIG. 13 shows a schematic cross-sectional view of one embodiment of a rapid thermal anneal chamber. The RTA 900 chamber defines an enclosure 902 and comprises a heater plate 904, a heater 907 and a plurality of substrate support pins 906. The enclosure 902 is defined by a base 908, a sidewall 910 and a top 912. Preferably, a cold plate 913 is disposed below the top 912 of the enclosure. Preferably, a reflector insulator dish 914 is disposed inside the enclosure 902 on the base 908. The reflector insulator dish 914 is typically made from a material that can withstand high temperatures (i.e., greater than about 500° C.), and act as a thermal insulator between the heater 907 and the enclosure 902. The dish 914 may also be coated with a reflective material, such as gold, to direct heat back to the heater plate 904.

The heater plate 904 preferably has a large mass compared to the substrate being processed in the system and is preferably fabricated from a material such as silicon carbide, quartz, or other materials that do not react with any ambient gases in the RTA chamber 900 or with the substrate material. The heater 907 typically comprises a resistive heating element or a conductive/radiant heat source and is disposed between the heater plate 904 and the reflector insulator dish 914. The heater 907 is connected to a power source 916 which supplies the energy needed to heat the heater 907. Preferably, a thermocouple 920 is disposed in a conduit 922, disposed through the base 908 and dish 914, and extends into the heater plate 904. The thermocouple 920 is connected to a controller (i.e., the system controller described below) and supplies temperature measurements to the controller. The controller then increases or decreases the heat supplied by the heater 907 according to the temperature measurements and the desired anneal temperature.

The enclosure 902 preferably includes a cooling member 918 disposed outside of the enclosure 902 in thermal contact with the sidewall 910 to cool the enclosure 902. The cold plate 913 disposed on the inside surface of the top 912 cools a substrate that is positioned in close proximity to the cold plate 913.

The RTA chamber 900 includes a slit valve 922 disposed on the sidewall 910 of the enclosure 902 for facilitating transfers of substrates into and out of the RTA chamber by used of a loading station transfer robot. The slit valve 922 selectively seals an opening 924 on the sidewall 910 of the enclosure that communicates with a loading station.

The substrate support pins 906 preferably comprise distally tapered members constructed from high temperature resistant materials. Each substrate support pin 906 is disposed within a tubular conduit 926, preferably made of a heat and oxidation resistant material, that extends through the heater plate 904. The substrate support pins 906 are connected to a lift plate 928 for moving the substrate support pins 906 in a uniform manner. The lift plate 928 is attached to an to an actuator 930, such as a stepper motor, through a lift shaft 932 that moves the lift plate 928 to facilitate positioning of a substrate at various vertical positions within the RTA chamber. The lift shaft 932 extends through the base 908 of the enclosure 902 and is sealed by a sealing flange 934 disposed around the shaft.

To transfer a substrate into the RTA chamber 900, the slit valve 922 is opened, and the loading station transfer robot extends its robot blade having a substrate positioned thereon through the opening 924 into the RTA chamber. The robot blade of the loading station transfer robot positions the substrate in the RTA chamber above the heater plate 904, and the substrate support pins 906 are extended upwards to lift the substrate above the robot blade. The robot blade then retracts out of the RTA chamber, and the slit valve 922 closes the opening. The substrate support pins 906 are then retracted to lower the substrate to a desired distance from the heater plate 904. Optionally, the substrate support pins 906 may retract fully to place the substrate in direct contact with the heater plate.

Preferably, a gas inlet 936 is disposed through the sidewall 910 of the enclosure 902 to allow selected gas flow into the RTA chamber 900 during the anneal treatment process. The gas inlet 936 is connected to a gas source 938 through a valve 940 for controlling the flow of the gas into the RTA chamber 900. A gas outlet 942 is preferably disposed at a lower portion of the sidewall 910 of the enclosure 902 to exhaust the gases in the RTA chamber and is preferably connected to a relief/check valve 944 to prevent backstreaming of gases from outside of the chamber. Optionally, the gas outlet 942 is connected to a vacuum pump (not shown) to exhaust the RTA chamber to a desired vacuum level during an anneal treatment. The RTA chamber is further described in co-pending U.S. patent application Ser. No. 09/263,126, entitled "Apparatus for Electro Chemical Deposition of Copper Metallization with the Capability of In-Situ Thermal Annealing," filed on Mar. 5, 1999, which is incorporated herein by reference to the extent not inconsistent with this invention.

Figure 14:
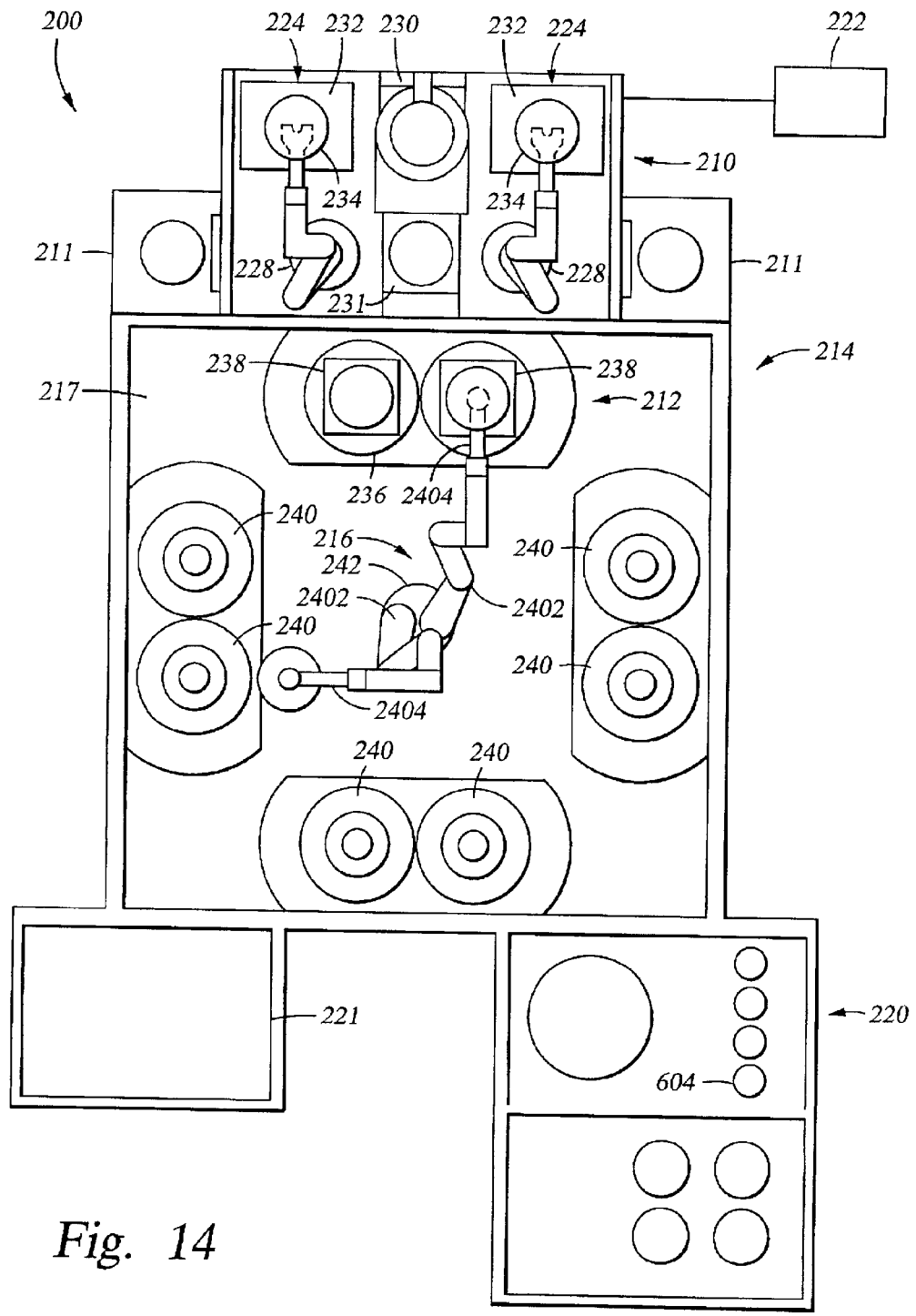
FIG. 14 shows a schematic top view of one embodiment of an exemplary electroless deposition system platform useful in the electroless deposition of a catalytic layer and a conductive material layer.

FIG. 14 shows a schematic top view of one embodiment of an electroless deposition system platform 200 useful in the deposition of the catalytic layer and electroless deposition of the conductive material layer. The electroless deposition system platform 200 having deposition cells is also described in co-pending U.S. patent application Ser. No. 09/289,074, entitled "Electro-Chemical Deposition System," filed on Apr. 8, 1999, and in co-pending U.S. patent application Ser. No. 09/263,126, entitled "Apparatus for Electro Chemical Deposition of Copper Metallization with the Capability of In-Situ Thermal Annealing," filed on Mar. 5, 1999, both which are incorporated herein by reference to the extent not inconsistent with this invention.

The electroless deposition system platform 200 generally comprises a loading station 210, a thermal anneal chamber 211, a mainframe 214, and an electrolyte replenishing system 220. The mainframe 214 generally comprises a mainframe transfer station 216, a spin-rinse dry (SRD) station 212, and six processing cells 240. The mainframe 214 includes a base 217 having cut-outs to support various stations needed to complete the deposition process. An electrolyte replenishing system 220 is positioned adjacent the mainframe 214 and connected to the process cells 240 individually to circulate electrolyte used for the electroless deposition processes. The electroless deposition system platform 200 also includes a power supply station 221 for providing electrical power to the system and a control system 222, typically comprising a programmable microprocessor.

The loading station 210 preferably includes one or more substrate cassette receiving areas 224, one or more loading station transfer robots 228 and at least one substrate orientor 230. A number of substrate cassette receiving areas, loading station transfer robots 228 and substrate orientor included in the loading station 210 can be configured according to the desired throughput of the system. As shown for one embodiment, the loading station 210 includes two substrate cassette receiving areas 224, two loading station transfer robots 228 and one substrate orientor 230. A substrate cassette 232 containing substrates 234 is loaded onto the substrate cassette receiving area 224 to introduce substrates 234 into the electroless deposition system platform. The loading station transfer robot 228 transfers substrates 234 between the substrate cassette 232 and the substrate orientor 230. The loading station transfer robot 228 comprises a typical transfer robot commonly known in the art. The substrate orientor 230 positions each substrate 234 in a desired orientation to ensure that the substrate is properly processed. The loading station transfer robot 228 also transfers substrates 234 between the loading station 210 and the SRD station 212 and between the loading station 210 and the thermal anneal chamber 211. The loading station 210 preferably also includes a substrate cassette 231 for temporary storage of substrates as needed to facilitate efficient transfer of substrates through the system.

A mainframe transfer robot 242 may be disposed in the center of the mainframe 214. The mainframe transfer robot 242 serves to transfer substrates between different stations attached to the mainframe station, including the processing stations and the SRD stations. The mainframe transfer robot 242 includes a plurality of robot arms 2404 independently moveable with respect to one another. The main transfer robot 242 is capable of transferring substrates between different stations attached to the mainframe.

The rapid thermal anneal (RTA) chamber 211 is preferably connected to the loading station 210, and substrates are transferred into and out of the RTA chamber 211 by the loading station transfer robot 228. The electroless deposition system preferably comprises two RTA chambers 211 disposed on opposing sides of the loading station 210, corresponding to the symmetric design of the loading station 210.

The SRD station 212 includes one or more SRD modules 236 and one or more substrate pass-through cassettes 238. Preferably, the SRD station 212 includes two SRD modules 236 corresponding to the number of loading station transfer robots 228, and a substrate pass-through cassette 238 is positioned above each SRD module 236. The substrate pass-through cassette 238 facilitates substrate transfer between the loading station 210 and the mainframe 214. The substrate pass-through cassette 238 provides access to and from both the loading station transfer robot 228 and the transfer robot 242 in the mainframe transfer station 216.

In one embodiment of the electroless deposition system, the six processing cells 240 comprise two electroless deposition chambers for the deposition of a catalytic layer (such as the chambers described in reference to FIGS. 2–12), and four electroless deposition chambers for the deposition of a conductive material layer (such as the chambers described in reference to FIGS. 2–12). In another embodiment, the six processing cells 240 comprise six dual purpose electroless chambers which are adapted to deposit both a catalytic layer and a conductive material layer by electroless deposition (such as the chambers described in reference to FIGS. 2–12). In still another embodiment, at least one of the six processing cells 240 comprises an electroplating chamber for the deposition of a conductive material layer. For example, the system may comprises two electroless deposition chambers for the deposition of a catalytic layer (such as the chambers described in reference to FIGS. 2–12), two electroless deposition chambers for the deposition of a conductive material layer (such as the chambers described in reference to FIGS. 2–12), and two electroplating chambers for the deposition of a conductive material layer. Alternatively, the system may comprise four dual purpose electroless chambers which are adapted to deposit both a catalytic layer and a conductive material layer and two electroplating chambers for the deposition of a conductive material layer.

Figure 15:
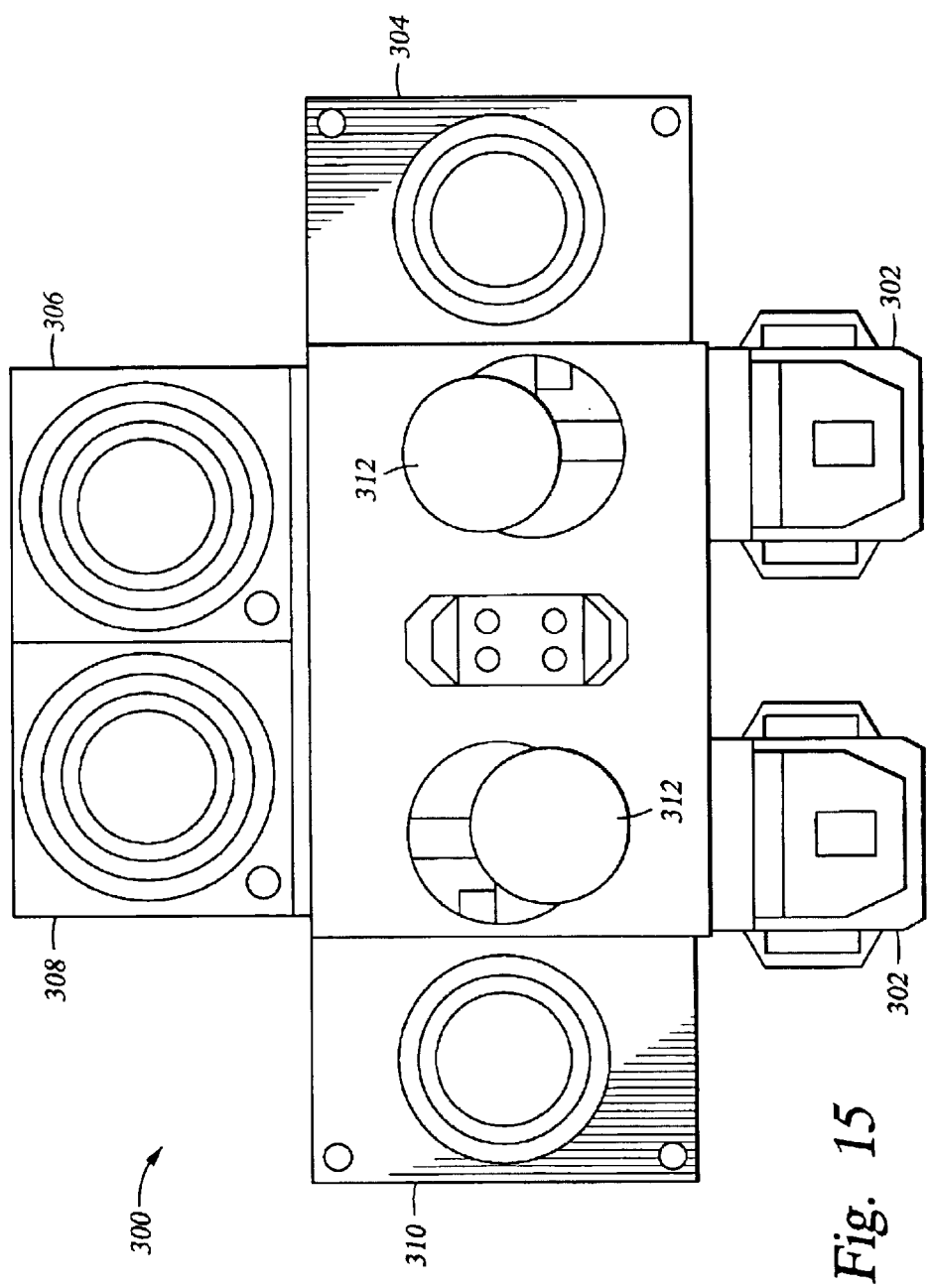
FIG. 15 shows a schematic top view of one embodiment of an exemplary electroless deposition system platform useful in the deposition of a catalytic layer and a conductive material layer.

FIG. 15 shows a schematic top view of another embodiment of an electroless deposition system platform 300 useful in the electroless deposition of a catalytic layer and electroless deposition of a conductive material layer. The electroless deposition system platform 300 generally comprises cassettes 302, an electroless chamber 304 adapted to deposit a catalytic layer (such as the chambers described in reference to FIGS. 2–12), an electroless deposition chamber 306 adapted to deposit a conductive material layer (such as the chambers described in reference to FIGS. 2–12), a SRD chamber 308, and an anneal chamber 310 (such as the chambers described in reference to FIG. 13). One or more transfer robots 312 may be disposed in the center of the platform 300 for transferring substrates between the different chambers and to and from the cassettes 302.

Another embodiment of an electroless deposition system platform (not shown) useful in the deposition of the catalytic layer and electroless deposition of a conductive material layer comprises two electroless deposition chambers for the deposition of a catalytic layer, four electroless deposition chambers for the deposition of a conductive material layer, and four electroplating chambers for the deposition of a conductive material layer.

Method of Electroless Deposition of a Catalytic Layer

The chambers and platforms as described herein may be used to implement various processes. Illustrative processes will now be described. In one embodiment, electroless deposition of the catalytic layer comprises contacting the substrate structure with an aqueous electroless deposition solution comprising colloids comprising 1) noble metal ions, semi-noble metal ions, or combinations thereof, and 2) Group IV metal ions, such as tin ions. In another embodiment, electroless deposition of the catalytic layer comprises contacting the substrate structure with an aqueous electroless deposition solution of Group IV metal ions, such as tin ions, and then contacting the substrate structure with an aqueous electroless deposition solution comprising noble metal ions, semi-noble metal ions, or combinations thereof. Examples of noble metals include gold, silver, platinum, palladium, iridium, rhenium, mercury, ruthenium, and osmium. Preferably, the noble metal used in the present method comprises palladium or platinum, and most preferably the noble metal comprises palladium. Examples of semi-noble metals include iron, cobalt, nickel, copper, carbon, aluminum and tungsten. Preferably, the semi-noble metal used in the present invention comprises cobalt, nickel, or tungsten. Examples of Group IV metals include tin, titanium, and germanium. Preferably, the Group IV metal used in the present method comprises tin.

The noble metal/semi-noble metal (the "noble metal/semi-noble metal" as used herein means noble metal and/or semi-noble metal) and the Group IV metal may be added to the electroless deposition solution as an inorganic and/or organic salt. Examples of salts which may be used include chlorides, bromides, fluorides, fluoborates, iodides, nitrates, and sulfates. Preferably, the metal salts are chlorides, such as palladium chloride ($PdCl_2$), chloroplatinic acid ($H_2PtCl_6$), and stannous chloride ($SnCl_2$).

In one embodiment, the ratio of the Group IV metal ions to the noble metal/semi-noble metal ions utilized (such as the ratio of Sn to Pd) in the electroless deposition, whether the Group IV metal and the noble metal/semi-noble metal ions are deposited separately or together as colloids, is between about 1:1 to about 40:1. Preferably, the electroless deposition solution for depositing the catalytic layer is acidic. Acids which may be used include hydrochloric acid (HCl), sulfuric acid ($H_2SO_4$), fluoboric acid ($HBF_4$), hydroiodic acid (HI), and acetic acid ($CH_3COOH$). Preferably, hydrochloric acid is used. The electroless deposition solution for depositing a catalytic layer may also comprise other additives such as surfactants and wetting agents. In one embodiment, the electroless deposition solution for depositing the catalytic layer has an initial pH of less than or equal to about 1. In one particular embodiment, an electroless deposition solution for depositing a catalytic layer comprises between about 0.3 g/L to about 1.4 g/L of Pd; between about 15 g/L to about 60 g/L of Sn or preferably between 25 to about 30 g/L of Sn; and about 20% to about 60% by volume of a strong acid such as HCL or preferably 30% to 40% by volume of a strong acid such as HCL acid. Exemplary electroless deposition solutions for depositing a catalytic layer are available from Enthone-OMI Inc. located in West Haven, Conn.

One embodiment of a method of electroless deposition of a catalytic layer comprises contacting the substrate structure with an electroless deposition solution comprising noble metal ions and/or semi-noble metal ions and Group IV metal ions at a reaction temperature between about 20° C. and about 150° C. For the deposition of palladium and tin, a preferred reaction temperature is between about 20° C. and about 80° C., with a reaction temperature between about 40° C. and about 60° C. being more preferred. The amount of solution used during electroless deposition may vary depending on the electroless deposition apparatus used and the size of the substrate to be processed. In one embodiment, between about 3 ml and about 200 ml of the electroless deposition solution is used for a 200 mm wafer. The reaction temperature refers to the temperature of the solution and/or the substrate since the reaction temperature can be provided by heating the solution, heating the substrate, or heating both the solution and the substrate. The time period in which the substrate is contacted with the electroless deposition solution may vary. For example, an electroless deposition solution comprising a high concentration of noble metal/semi-noble metal ions and Group IV metal ions may be used at a high temperature for a short time period to deposit a catalytic layer to a desired thickness. An electroless deposition solution comprising a low concentration of noble metal/semi-noble metal ions may be used at a low temperature for a long time period to deposit a catalytic layer to the same thickness. In one embodiment, contacting the substrate structure with the electroless deposition solution may be performed for a time period of at least 5 seconds, preferably between about 30 seconds to about 120 seconds. Contacting the substrate structure with the electroless deposition solution may be performed to deposit a catalytic layer having at least a monolayer thickness. In one embodiment, the catalytic layer is deposited to a thickness between about 5 Å to about 100 Å.

Another embodiment of a method of electroless deposition of a catalytic layer comprises contacting the substrate structure with separate electroless deposition solutions of noble metal/semi-noble metal ions and Group IV metal ions. One embodiment of electroless deposition of a catalytic layer utilizing separate electroless deposition solutions comprises first contacting the substrate structure with an electroless deposition solution comprising Group IV metal ions, such as tin ions and, then, contacting the substrate structure with an electroless deposition solution comprising noble metal ions, semi-noble metal ions, or combinations thereof. The substrate may be contacted with an electroless deposition solution comprising Group IV metal ions, such as tin, at a reaction temperature between about 20° C. to about 150° C., preferably between about 20° C. to about 50° C., more preferably between about 20° C. to about 40° C. In one embodiment, between about 3 ml and about 200 ml of the electroless deposition solution is used for a 200 mm wafer. Contacting the substrate structure with the electroless deposition solution comprising Group IV metal ions may be performed for a time period of at least 5 seconds, preferably between about 30 seconds to about 120 seconds. The substrate may optionally then be rinsed with at least one rinsing solution. The rinsing solution may comprise deionized water, hot deionized water, caustic solutions (acid or base solutions), hot caustic solutions, salt solutions, or hot salt solutions. Then, the substrate is contacted with an electroless deposition solution comprising noble metal ions, semi-noble metal ions, or combinations thereof at a reaction temperature between about 20° C. to about 150° C. For the deposition of palladium, a preferred reaction temperature is between about 20° C. and about 80° C., with a reaction temperature between about 40° C. and about 60° C. being more preferred. In one embodiment, between about 3 ml and about 200 ml of the electroless deposition solution is used for a 200 mm wafer. Contacting the substrate structure with the electroless deposition solution comprising noble metal ions, semi-noble metal ions, or combinations there of may be performed for a time period of at least 5 seconds, preferably between about 30 seconds to about 120 seconds. Contacting the substrate structure with the separate electroless deposition solutions may be performed to deposit a catalytic layer comprising a noble metal and/or semi-noble metal and a Group IV metal having at least a monolayer thickness. In one embodiment, the noble metal/semi-noble metal and the Group IV metal have a combined thickness of about 5 Å to about 100 Å.

After the catalytic layer has been deposited, the catalytic layer may be rinsed with at least one rinsing solution comprising deionized water, hot deionized water, caustic solutions (acid or base solutions), hot caustic solutions, salt solutions, or hot salt solutions. Preferably, hot deionized water is used, preferably at a temperature between from the lower limits of about 40° C. or about 70° C. to the upper limits of about 90° or about 100° C., with a range from any lower limit to any upper limit being within the scope of the present invention. One preferred range is between about 40° C. to about 90° C. The method may further include rinsing the substrate with an acidic solution after rinsing the substrate with deionized water, such as hot deionized. One example of an acidic solution for rinsing the substrate comprises a solution having between about 5% to about 20% by volume of a strong acid, such as HCl. It is believed that the acidic solution acts to form tin hydroxides which may be rinsed away more easily. In another embodiment, instead of a rinse with deionized water and then a rinse with an acidic solution, the method may include a rinse with an acidic solution followed by a rinse with deionized water, such as hot deionized water. Then, the catalytic layer may be further rinsed with a base solution to prepare the substrate for deposition of a conductive material layer utilizing a basic electroless deposition solution.

The method of depositing the catalytic layer may include applying a bias to a conductive portion of the substrate structure (i.e. a seed layer), such as a DC bias, during the electroless deposition of the catalytic layer. It is believed that the bias helps to remove trapped hydrogen gas formed in the catalytic layer during the deposition process.

The method may include annealing (i.e., heating) the catalytic layer at a temperature between about 100° C. to about 400 C., preferably between about 100° C. to about 300° C. The anneal may be performed in a vacuum, preferably at a pressure lower than 1 mtorr. Alternatively, the anneal may be performed in a gas atmosphere, such as a gas atmosphere of one or more noble gases (such as Argon, Helium), nitrogen, hydrogen, and mixtures thereof. In one embodiment, the anneal is performed for a time period of at least about 1 minute. In another embodiment, the anneal is performed for a time period of about 1 to about 10 minutes. Preferably, the anneal is conducted by a rapid thermal anneal process. It is believed that annealing the substrate promotes adhesion of the catalytic layer over the barrier layer, over the seed layer, or over the substrate structure. It is also believe that the anneal helps remove hydrogen formed in the catalytic layer during the deposition.

The method of depositing the catalytic layer may be performed in the electroless deposition chamber or chambers as described above. In one embodiment, the catalytic layer may be annealed in an electroless deposition chamber or may be annealed in a separate anneal chamber. In another embodiment, the rinse of the catalytic layer may be performed in an electroless deposition chamber or may be performed in a separate chamber.

Without limitation to a particular theory, it is believed that the mechanism in which the catalytic layer catalyzes subsequent electroless deposition of a conductive material layer, such as a copper layer, involves the formation of a metal complex of the noble metal/semi-noble metal and the Group IV metal, such as a Pd/Sn complex, whether the noble metal/semi-noble metal and the Group IV metal are deposited together or separately. The noble metal/semi-noble metal and the Group IV metal complex is believed to be formed in the processing solution as a colloid with a central portion comprising mostly of the noble metal/semi-noble metal and with an outer shell comprising a Group IV layer, such as a tin layer. Adhesive properties of the outer shell attach the colloid to the substrate. The charge of the outer shell prevents aggregation of the colloids permitting individual attachment of the colloid particles to the substrate. It is believed that the reaction temperature at which the catalytic layer is deposited helps control the rate of deposition. If the reaction temperature is too low, then the rate of deposition of the catalytic layer is too slow and would lower through-put of substrates through the system. If the reaction temperature is too high, then the rate of deposition of the catalytic layer is too fast, which may cause impurities to be incorporated into the catalytic layer during deposition.

Furthermore, it is believed that the metal complex core must be exposed for subsequent electroless deposition of a conductive material layer. It is believed that a hot deionized rinse followed by an acidic rinse is effective in exposing the core by rinsing away some of the Group IV metal, such as Sn, surrounding the noble metal/semi-metal core. Alternatively or additionally, it is believe that a hot deionized rinse followed by an acidic rinse rinses away both some of the Group IV metal and the noble metal/semi-noble metal which redeposit on the substrate to form an active surface for subsequent electroless deposition of a conductive material layer.

Methods of Electroless Deposition of a Conductive Material Layer

The conductive material layer 26 (FIGS. 1A–1D), such as a copper layer, may be deposited over the catalytic layer 24 (FIGS. 1A–D) by contacting the substrate structure with an electroless deposition solution comprising an aqueous solution of conductive metal ions and a reducing agent. In one embodiment, the solution for electroless deposition of copper includes a copper salt, such as copper sulfate (CuSO$_4$) copper chloride, copper iodide, as a source of the copper to be deposited. Because copper tends to precipitate above a pH of 3.5, the solution can include a complexing agent or chelating agent to form a metal complex and to prevent the precipitation of copper hydroxide. Examples of complexing or chelating agents include, tartate, EDTA, amines, aminopolyacetic acids, meso-erithritol, glycolic acid, and citric acid. The solution may also include a reducing agent to reduce the metal ions. Examples of reducing agents include formaldehyde, glycolic acid, glyoxylic acid, ascorbic acid, and sodium hypophosphate. The solution may also include pH adjusters. Examples of pH adjustors include sodium hydroxide, potassium, and ammonium hydroxides. The solution may also include a stabilizer, such as mercaptobenzothiazole, thiorea, cynide, vanadium pentoxide, methyl butynol, and selenium compounds. The solution may include other additives to improve deposit properties (such as ductility improvement). Example of additives include sodium cyanide, vanadium pentoxide, sodium aresenite, and polyethylene glycol. A typical chemical reaction among the principal components can be expressed as:

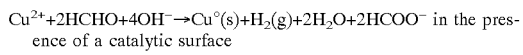

$Cu^{2+}+2HCHO+4OH^- \rightarrow Cu°(s)+H_2(g)+2H_2O+2HCOO^-$ in the presence of a catalytic surface The reaction thus delivers two electrons to the copper ions and deposits copper on a catalytic surface in which hydrogen gas is produced as a by product.

In one aspect, an electroless deposition solution may be mixed at a point of use. For example, the electroless deposition may be separated into two solutions. The first solution may comprise copper salts, complexing agents, additives, and stabilizers. The second solution may comprise reducing agents and pH adjusters. The first solution and the second solution are mixed just prior to being dispensed on a substrate to maintain the reactivity of the electroless deposition solutions.

One exemplary solution includes 0.02 mol/liter to about 0.4 mol/liter of copper sulfate, 0.04 mol/liter to about 0.2 mol/liter of ethylenediaminetetraacetic acid (EDTA) as a complexing agent, 0.45 mol/liter to about 0.6 mol/liter of sodium hydroxide to supply the OH$^-$ to achieve a pH preferably above about 11, 0.06 mol/liter to about 1.0 mol/liter of formaldehyde (HCHO) as the reducing agent. In one embodiment, the pH of the solution is adjusted to a pH of above about 11. In another embodiment, to resolve the integration issues of subsequent acidic electroplating baths, the electroless deposition solution is adjusted to an acidic pH for the subsequent electroplating of a conductive material over the conductive material deposited by electroless deposition.

In one embodiment, contacting the substrate structure with an electroless copper solution may be performed at a reaction temperature between about 20° C. and about 100° C., preferably, between about 40° C. to about 80° C. The amount of solution used during electroless deposition may vary depending on the electroless deposition apparatus used and the size of the substrate to be processed. In one embodiment, between about 10 ml and about 400 ml are used for a 200 mm wafer. Contacting the substrate structure with an electroless copper solution may be performed for a time period of at least 5 seconds. Contacting the substrate structure with an electroless copper solution may be performed for a time period between about 45 seconds to about 120 seconds to deposit a copper layer to a thickness of less than 500 Å if used as a seed layer, and preferably between about 50 Å to about 300 Å. Alternatively, the electroless copper deposition may be performed to deposit a copper layer to fill a feature, such as to a thickness of up to one micron or more. If used to fill a feature, the electroless copper solution may further comprise additives such as accelerators, suppressors, and levelers, to aid in bottom-up filling of the feature. After deposition, the surface of the substrate may be rinsed, such as a deionized water rinse to remove the remaining electroless deposition solution, and then dried. The rinse of the conductive layer may be performed in an electroless deposition chamber or may be performed in a separate chamber, such as SRD chamber.

The method of depositing the conductive layer may include applying a bias to the substrate structure, such as a DC bias, during the electroless deposition of the conductive layer. It is believed that the bias helps to remove trapped hydrogen gas formed in the conductive layer during the deposition process. In one embodiment, a power supply is coupled to a conductive portion of the substrate, such as a PVD copper seed layer, to bias the substrate structure. In one embodiment, a positive pole of a power supply may be coupled to the substrate and a negative pole of the power supply may be coupled to an electrode in contact with the electroless copper solution on the substrate. The positive pole provides a positive bias to the substrate structure and a negative bias to the electrode. This bias helps remove positive hydrogen ions from the electroless deposited copper layer since the positive substrate structure repels the positive hydrogen ions and the negative bias of the electrode attracts the positive hydrogen ions. In one embodiment, the power supply provides a cell potential of less than +0.337 V to prevent deplating of the copper layer. In another embodiment, the polarity of the power supply may be flipped back and forth to prevent deplating of the conductive copper layer.

In another embodiment, a negative pole of a power supply may be coupled to the substrate and a positive pole of the power supply may be coupled to an electrode in contact with the electroless copper solution. A bias may be applied to the substrate structure to help "jump start" the copper electroless deposition process. The power supply may provide a cell potential of less than or greater than +0.337 V in order to "jump start" the copper electroless deposition process. In one embodiment, the bias may be applied for a short period of time during the electroless deposition process, for example between about a millisecond or less to about one second. In another embodiment, the bias may be applied for a longer period of time, for example between greater than about one second to about the duration of the electroless deposition process.

The method may further include annealing (i.e. heating) the substrate at a temperature between about 100° C. to about 400° C., preferably between about 100° C. to about 300° C. The anneal may be performed in a vacuum, preferably at a pressure lower than 1 mtorr. Alternatively, the anneal may be performed in a gas atmosphere, such as a gas atmosphere of a noble gas, nitrogen, hydrogen, and mixtures thereof. In one embodiment, the anneal is performed for a time period of at least about 1 minute. In another embodiment, the anneal is performed for a time period of about 1 to about 10 minutes. Preferably, the anneal is conducted by a rapid thermal anneal process.

In one embodiment, the anneal is preformed in a two step process. First, the substrate is annealed in the absence of a hydrogen atmosphere to remove hydrogen formed in the copper conductive layer. Second, the anneal is performed in a hydrogen atmosphere prior to removal from the chamber in order reduce the amount of copper oxides formed from the copper conductive layer.

The anneal may be performed in addition to, or alternately to, the anneal after deposition of the catalytic layer. Preferably, an anneal of the conductive layer is performed rather than an anneal of the catalytic layer. It is believed that annealing the substrate promotes adhesion of the conductive layer. It is further believed that the anneal helps to remove trapped hydrogen gas in the electroless copper layer during the deposition. In addition, it is believed that removing trapped hydrogen gas lowers the resistivity of the conductive material layer by removing the hydrogen voids in the conductive material layer. It is also believed that the anneal promotes the recrystallization of copper conductive layer.

Electroplating of a Catalytic Layer

The catalytic layer may also be deposited by electroplating. One embodiment of an apparatus capable of depositing a catalytic layer by an electroplating process is an ELECTRA CU™ ECP platform, available from Applied Materials, Inc. of Santa Clara, Calif. The electroplating apparatus is more fully described in U.S. patent application Ser. No. 09/289,074, entitled "Electro-Chemical Deposition System" filed Apr. 8, 1999, which is incorporated by reference to the extent not inconsistent with this invention. Electroplating involves passing an electric current between an anode and a substrate acting as the cathode in an electrochemical bath containing metal ions to deposit a metal or an alloy layer on the substrate.

The catalytic layer deposited by electroplating may comprise a noble metal, a semi-noble metal, alloys thereof, or combinations thereof. Preferably, the catalytic layer deposited by electroplating comprises cobalt, palladium, platinum, nickel, tungsten, alloys thereof, and combinations thereof. One embodiment of the catalytic layer comprising an alloy includes cobalt-nickel, cobalt-tungsten, and cobalt-palladium. Electroplating solution typically comprises metal ions of the metal desired to be plated as a metal salt, such as a metal sulfate, a metal chloride, a metal sulfamate, and combinations thereof. Typically, the electroplating solution also comprises acids, salts, other electrolytes, and other additives. Electrodeposition of the catalytic layer may further include annealing the substrate.

Chemical Vapor Deposition of a Catalytic Layer

The catalytic layer may also be deposited by chemical vapor deposition. An example of a chamber capable of chemical vapor deposition of a catalytic layer is a CVD TxZ™ chamber, available from Applied Materials, Inc. of Santa Clara, Calif. Generally, chemical vapor deposition involves flowing in a metal precursor with the use of a carrier gas into the chamber. The metal precursor chemically reacts to deposit a metal film on the substrate surface. Chemical vapor deposition may further include utilizing a plasma to aid in the deposition of the metal film on the substrate surface. The catalytic layer deposited by chemical vapor deposition may comprise a noble metal, a semi-noble metal, alloys thereof, or combinations thereof. Chemical vapor deposition of the catalytic layer may further include annealing the substrate.

Electroplating of a Conductive Material Layer

In one embodiment, the conductive material layer 26, such as a copper layer, may be deposited by electroplating over the catalytic layer 24. In another embodiment, the conductive material layer 26 may be deposited by electroless deposition of a conductive material over the catalytic layer followed by electroplating of a conductive material.

An apparatus capable of depositing a conductive material by an electroplating process is an Electra Cu™ ECP platform. The electroplating apparatus is more fully described in U.S. patent application Ser. No. 09/289,074, entitled "Electro-Chemical Deposition System" filed Apr. 8, 1999, which is incorporated by reference to the extent not inconsistent with this invention. Electroplating involves the deposition of a layer of conductive material on a substrate by passing an electric current between an anode and the substrate acting as the cathode in an electrochemical bath containing ions of the conductive material.

An exemplary electroplating chemistry for depositing a copper layer in a system containing a consumable anode is described in co-pending U.S. application Ser. No. 09/245,780, filed on Feb. 5, 1999, entitled, "Electrodeposition Chemistry For Improved Filling Of Apertures", and is incorporated herein by reference to the extent not inconsistent with this invention. An exemplary electroplating method is also described in U.S. Pat. No. 6,113,771, entitled "Electro Deposition Chemistry", issued Sep. 5, 2000, and is incorporated herein by reference to the extent not inconsistent with this invention.

In general, the method of electroplating the conductive material layer over a substrate structure comprises connecting the substrate structure to a negative terminal of an electrical power source, disposing the substrate structure and an anode in a solution comprising metal ions and a supporting electrolyte, and electrodepositing the metal onto the substrate structure from the metal ions in the solution.

Chemical Vapor Deposition of a Conductive Material Layer

In one embodiment, the conductive material layer 26, such as a copper layer, may be deposited by chemical vapor deposition over the catalytic layer 24. In another embodiment, the conductive material layer 26 may be deposited by electroless deposition of a conductive material over the catalytic layer followed by chemical vapor deposition of a conductive material.

An apparatus capable of depositing a conductive material by a chemical vapor deposition process is a CVD Cu chamber available from Applied Materials, Inc. of Santa Clara, Calif. An exemplary chemical vapor deposition process for depositing a copper layer is described in U.S. Pat. No. 6,110,530, entitled "CVD method of depositing copper films by using improved organocopper precursor blend," issued Aug. 29, 2000, and is incorporated herein by reference to the extent not inconsistent with this invention.

Generally, chemical vapor deposition of a conductive material layer involves flowing in a metal precursor with the use of a carrier gas, such as argon, into the chamber. Examples of a copper precursor include copper$^{+2}$(hfac)$_2$, Cu$^{+2}$(fod)$_2$, and complex copper$^{+1}$hfac, TMVS (fod being an abbreviation for heptafluoro dimethyl octanediene, hfac being an abbreviation for the hexafluoro acetylacetonate anion, and TMVS being an abbreviation for trimethylvinylsilane). The metal precursor chemically reacts to deposit a metal film on the substrate surface. Chemical vapor deposition may further include utilizing a plasma to aid in the deposition of the metal film on the substrate surface.

EXAMPLES

Various trials were conducted in depositing a catalytic layer and a conductive material layer. Some of the examples are set forth below.

Example A

A 700 Å PVD copper seed layer was deposited over substrate structures having 0.2 micron features having an aspect ratio of about 5 to about 1. A catalytic layer comprising tin and palladium was deposited by electroless deposition over the PVD copper seed layer at a reaction temperature of about 40° C. for a time period of 30 seconds, 60 seconds, 120 seconds, or 240 seconds. The catalytic layer was deposited utilizing an electroless deposition solution comprising 0.7 g/L of Pd, 25–30 g/L of Sn, and 30%–40% of HCl by volume. Scanning electron microscope photographs of the substrates showed that for catalytic layers deposited for a time period of 120 seconds or 240 seconds, the acidic electroless deposition solution of the catalytic layer would begin to dissolve and create holes in the PVD copper seed layer. Catalytic layers deposited for a time period of 30 seconds or 60 seconds showed good step coverage of the features without creating holes in the PVD copper seed layer.

Example B

A thin PVD copper seed layer was deposited over substrate structures having 0.2 micron features having an aspect ratio of about 5 to about 1. A catalytic layer comprising tin and palladium was deposited by electroless deposition over the thin PVD copper seed layer for a time period of 30 seconds at a reaction temperature of room temperature, 40° C., 60° C., or 80° C. The catalytic layer was deposited utilizing an electroless deposition solution comprising 0.7 g/L of Pd, 25–30 g/L of Sn, and 30%–40% of HCL. Scanning electron microscope photographs of the substrates showed that for catalytic layers deposited at room temperature the catalytic layer had a very rough surface.

Example C

A thin PVD copper seed layer was deposited over substrate structures having 0.2 micron features having an aspect ratio of about 5 to about 1. A catalytic layer comprising tin and palladium was deposited by electroless deposition over the thin PVD copper seed layer for a time period of 30 seconds at a reaction temperature of 60° C. The catalytic layer was deposited utilizing 100 ml of an electroless deposition solution comprising 0.7 g/L of Pd, 25–30 g/L of Sn, and 30%–40% of HCl by volume. In some trials, an additional 5 ml, 10 ml, or 20 ml of concentrated HCl was added to the 100 ml of electroless deposition solution. Scanning electron microscope photographs showed that there was not much impact to the copper seed layer between catalytic layers deposited with no additional HCl and catalytic layers deposited with an additional 5 ml, 10 ml, or 20 ml of HCl.

Example D

A thin PVD copper seed layer was deposited over substrate structures having 0.2 micron features having an aspect ratio of about 5 to about 1. A catalytic layer comprising tin and palladium was deposited by electroless deposition over the PVD copper seed layer at a reaction temperature of about 40° C. for a time period of 30 seconds utilizing an electroless deposition solution comprising 0.7 g/L of Pd, 25–30 g/L of Sn, and 30%–40% of HCl by volume. A conductive material layer was deposited by electroless deposition over the catalytic layer at a reaction temperature of 60° C. for a time period of 30 seconds, 60 seconds, or 120 seconds utilizing an electroless deposition solution comprising copper ions. Scanning electron microscope photographs showed that the conductive material layer was discontinuous for conductive material layers deposited for a time period of 30 seconds or 60 seconds. Conductive material layers deposited for 120 seconds were continuous.

Example E

A TaN barrier layer was deposited over a substrate. A thin PVD copper seed layer was deposited over the barrier layer. A catalytic layer comprising tin and palladium was deposited by electroless deposition over the PVD copper seed layer at a reaction temperature of about 60° C. for a time period of 15 seconds, 30 seconds, 45 seconds, or 60 seconds. The catalytic layer was deposited utilizing an electroless deposition solution comprising 0.7 g/L of Pd, 25–30 g/L of Sn, and 30%–40% of HCl by volume. A copper conductive material layer was deposited over the catalytic layer by electroless deposition at 60° C. for 120 seconds. The atomic concentration of elements at certain depths of the deposited films were measured utilizing auger electron spectroscopy. For a copper conductive material layer deposited over a catalytic layer deposited for 15 seconds, the atomic concentration of Pd and Sn was high at the surface of the film stack indicating that the catalytic layer had a rough surface. For a copper conductive material layer deposited over a catalytic layer deposited for 30 seconds, 45 seconds, or 60 seconds, the concentration of Pd and Sn was low at the surface of the film stack indicating a smooth catalytic layer. Without limitation to any particular theory, it is believed that a certain amount of time is necessary for the deposition of a catalytic layer to allow the Pd/Sn particles to coalesce to form a smooth surface.

Example F

A 250 Å Ta barrier layer was deposited over substrate structures having sub 0.2 micron features having aspect ratios of greater than 6:1, 8:1, or 10:1. A 400 Å PVD Cu seed layer was deposited over the barrier layer. A Pd/Sn catalytic layer was deposited by electroless deposition at 40° C. for 30 seconds over the Cu seed layer. A copper conductive material layer was deposited over the catalytic layer by electroless deposition at 60° C. for 120 seconds. Scanning electron microscope photographs showed good step coverage of the electroless deposited copper conductive material layers over sub-micron features.

Example G

A Pd/Sn catalytic layer was deposited by electroless deposition over substrate structures having sub 0.2 micron features having an aspect ratio of greater than about 6 to 1. A copper conductive material layer was deposited by electroless deposition over the catalytic layer. A second copper conductive material layer was deposited over the copper material layer by electroplating. Scanning electron microscope photographs showed that the features were filled with copper conductive material without any apertures or seams.

While the foregoing is directed to embodiments of the present invention, other and further embodiments of the invention may be devised without departing from the basic scope thereof, and the scope thereof is determined by the claims that follow.

What is claimed is:

1. A method of depositing a conductive material in a sub-micron feature formed on a substrate structure of a substrate, comprising:

depositing a catalytic layer by electroless deposition, the catalytic layer comprising a metal selected from the group consisting of a noble metal, a semi-noble metal, and combinations thereof and comprising a Group IV metal; and depositing a conductive material layer to a thickness of less than about 500 Å over the catalytic layer by electroless deposition, wherein the semi-noble metal comprises a metal selected from the group consisting of cobalt, nickel, and tungsten.

2. The method of claim 1, wherein depositing the conductive material layer comprises depositing the conductive material layer to a thickness of less than about 300 Å.

3. The method of claim 1, further comprising depositing a second conductive material layer over the conductive material layer.

4. The method of claim 1, wherein the catalytic layer is deposited over the substrate structure, wherein the catalytic layer acts as a barrier layer.

5. The method of claim 1, further comprising depositing a barrier layer over the substrate structure and then depositing the catalytic layer over the barrier layer.

6. The method of claim 1, further comprising depositing a barrier layer over the substrate structure and depositing a conductive seed layer over the barrier layer and then depositing the catalytic layer over the conductive seed layer.

7. The method of claim 1, wherein the Group IV metal comprises tin.

8. The method of claim 1, wherein the noble metal comprises a metal selected the group consisting of palladium and platinum.

9. The method of claim 1, wherein depositing the catalytic layer comprises contacting the substrate structure with an electroless deposition solution comprising Group IV metal ions and comprising metal ions selected from the group consisting of noble metal ions, semi-noble metal ions, and combinations thereof.

10. The method of claim 1, wherein the catalytic layer is deposited to a thickness between about 5 Å to about 100 Å.

11. The method of claim 1, wherein depositing the catalytic layer comprises contacting the substrate structure with a first electroless deposition solution comprising Group IV metal ions, and contacting the substrate structure with a second electroless deposition solution comprising noble metal ions, semi-noble metal ions, and combinations thereof.

12. The method of claim 1, further comprising rinsing the catalytic layer with at least one rinsing solution selected from the group consisting of deionized water, hot deionized water, caustic solution, hot caustic solution, salt solutions, and hot salt solutions.

13. The method of claim 1, wherein depositing the conductive material layer comprises electroless deposition of a copper layer by contacting the substrate structure with a copper electroless deposition solution comprising copper ions.

14. The method of claim 1, wherein depositing the catalytic layer comprises providing an electroless deposition solution at a point-of-use.

15. The method of claim 1, wherein depositing the conductive material layer comprises providing an electroless deposition solution at a point-of-use.

16. A method of depositing a catalytic layer in a submicron feature formed on a substrate structure of a substrate, comprising:
contacting the substrate structure with an electroless deposition solution comprising Group IV metal ions and comprising metal ions selected from the group consisting of a noble metal, a semi-noble metal, and combinations thereof for a time period of between about 30 seconds and about 120 seconds at a reaction temperature between about 20° C. to about 150° C., wherein the semi-noble metal comprises a metal selected from the group consisting of cobalt, nickel, and tungsten.

17. The method of claim 16, wherein the Group IV metal comprises tin.

18. The method of claim 16, wherein the noble metal comprises a metal selected the group consisting of palladium and platinum.

19. The method of claim 16, contacting the substrate structure with the electroless deposition solution comprises contacting the substrate structure with between about 3 ml and about 200 ml of the electroless deposition solution for a 200 mm substrate.

20. The method of claim 16, wherein the electroless deposition solution is acidic.

21. The method of claim 16, wherein the electroless deposition is at an initial pH of less than or equal to about 1.

22. The method of claim 16, where the electroless deposition comprises tin ions and palladium ions.

23. The method of claim 22, wherein the electroless deposition solution comprises between about 0.3 g/L to about 1.4 g/L of Pd; between about 15 g/L to about 60 g/L of Sn; and about 20% to about 60% by volume of a strong acid.

24. The method of claim 23, wherein the electroless deposition solution comprises between 25 to about 30 g/L of Sn.

25. The method of claim 23, wherein the electroless deposition solution comprises between about 30% to 40% by volume of a strong acid.

26. The method of claim 22, wherein contacting the substrate structure with the electroless deposition solution is performed at a reaction temperature between about 20° C. and 80° C.

27. The method of claim 22, wherein contacting the substrate structure with the electroless deposition solution is performed at a reaction temperature between about 40° C. and about 60° C.

28. The method of claim 16, further comprising rinsing the catalytic layer with at least one rinsing solution selected from the group consisting of deionized water, hot deionized water, caustic solution, hot caustic solution, salt solutions, and hot salt solutions.

29. The method of claim 28, wherein rinsing the catalytic layer comprises rinsing the catalytic layer with hot deionized water at a temperature between about 70° C. to about 100° C.

30. The method of claim 29, wherein rinsing the catalytic layer further comprises rinsing the catalytic layer with an acidic solution after rinsing the substrate with hot deionized water.

31. A method of depositing a catalytic layer in a submicron feature formed on a substrate structure of a substrate, comprising:
contacting the substrate structure with a first electroless deposition solution comprising Group IV metal ions; and
contacting the substrate structure with a second electroless deposition solution comprising metal ions selected from the group consisting of noble metal ions, semi-noble metal ions, and combinations thereof, wherein the semi-noble metal comprises a metal selected from the group consisting of cobalt, nickel, and tungsten.

32. The method of claim 31, wherein the Group IV metal comprises tin.

33. The method of claim 31, wherein the noble metal comprises a metal selected the group consisting of palladium and platinum.

34. The method of claim 31, wherein the first electroless deposition solution is acidic.

35. The method of claim 31, wherein the second electroless deposition solution is acidic.

36. The method of claim 31, wherein contacting the substrate structure with the first electroless deposition solution comprises contacting the substrate structure with the first solution at a reaction temperature between about 20° C. and about 150° C.

37. The method of claim 31, wherein contacting the substrate structure with the first electroless deposition solution comprises contacting the substrate structure with the first electroless deposition solution at a reaction temperature between about 20° C. and about 50° C.

38. The method of claim 31, wherein contacting the substrate structure with the first electroless deposition solution comprising contacting the substrate structure with the first electroless deposition solution for a time period between about 30 seconds to about 120 seconds.

39. The method of claim 31, wherein contacting the substrate structure with the first electroless deposition solution comprises contacting the substrate structure with between about 3 ml and about 200 ml of the first electroless deposition solution for a 200 mm substrate.

40. The method of claim 31, further comprising rinsing the substrate between contacting the substrate structure with the first electroless deposition solution and contacting the substrate structure with the second electroless deposition solution, rinsing the substrate comprising contacting the substrate structure with at least one rinsing solution selected from the group consisting of deionized water, hot deionized water, caustic solution, hot caustic solution, salt solutions, and hot salt solutions.

41. The method of claim 31, wherein contacting the substrate structure with the second electroless deposition solution comprises contacting the substrate structure with the second electroless deposition solution at a reaction temperature between about 20° C. to about 150° C.

42. The method of claim 31, wherein contacting the substrate structure with the second electroless deposition solution comprises contacting the substrate structure with the second electroless deposition solution for a time period of about 30 seconds to about 120 seconds.

43. The method of claim 31, wherein contacting the substrate structure with the second electroless deposition solution comprises contacting the substrate structure with between about 3 ml and about 200 ml of the second electroless deposition solution for a 200 mm substrate.

44. The method of claim 31, further comprising rinsing the catalytic layer with at least one rinsing solution selected from the group consisting of deionized water, hot deionized water, caustic solution, hot caustic solution, salt solutions, and hot salt solutions.

45. The method of claim 44, wherein rinsing the catalytic layer comprises rinsing the catalytic layer with hot deionized water at a temperature between about 70° C. to about 100° C.

46. The method of claim 45, wherein rinsing the catalytic layer further comprises rinsing the catalytic layer with an acidic solution after rinsing the substrate with hot deionized water.

47. A method of depositing a conductive material layer in a sub-micron feature formed on a substrate structure of a substrate, comprising:
depositing a copper layer to a thickness less than 500 Å by electroless deposition, electroless deposition comprising contacting the substrate structure with a copper electroless deposition solution comprising copper ions, wherein the copper electroless deposition solution is at an initial acidic pH.

48. The method of claim 47, wherein the copper electroless deposition solution is adjusted to a pH of above about 11.

49. The method of claim 47, wherein the copper electroless deposition solution is formaldehyde-free.

50. The method of claim 47, wherein contacting the substrate structure with the copper electroless deposition solution is performed at a reaction temperature between about 20° C. and about 100° C.

51. The method of claim 47, wherein contacting the substrate structure with the copper electroless deposition solution is performed at a reaction temperature between about 40° C. and 80° C.

52. The method of claim 47, wherein contacting the substrate structure with the copper electroless deposition solution is performed for a time period between about 45 seconds to about 120 seconds.

53. The method of claim 50, wherein the copper layer is deposited to a thickness between about 50 Å to about 300 Å.

54. The method of claim 47, wherein depositing the copper layer comprises providing the copper electroless deposition solution at a point-of-use.

55. The method of claim 47, wherein the copper electroless deposition solution further comprises additives selected from the group consisting of accelerators, suppressors, levelers, and combinations thereof.

56. A method of depositing a conductive material in a sub-micron feature formed on a substrate structure, comprising:
depositing a catalytic layer by electroless deposition, the catalytic layer comprising a metal selected from the group consisting of a noble metal, a semi-noble metal, and combinations thereof and a-comprising a Group IV metal;
depositing a conductive material layer over the catalytic layer by electroless deposition; and
annealing the substrate structure.

57. The method of claim 56, wherein annealing the substrate structure comprises annealing the catalytic layer.

58. The method of claim 55, wherein annealing the substrate structure comprises heating the substrate structure to a substrate temperature between about 100° C. to about 400° C.

59. The method of claim 57, wherein annealing comprises annealing in a vacuum atmosphere.

60. The method of claim 57, wherein annealing comprises annealing in a gas atmosphere.

61. The method of claim 57, annealing comprises annealing in a non-hydrogen atmosphere and annealing in a hydrogen gas atmosphere.

62. The method of claim 56, wherein annealing the substrate structure comprises annealing the conductive material layer.

63. The method of claim 62, wherein annealing the substrate comprises heating the substrate structure to a substrate temperature between about 100° C. to about 400° C.

64. The method of claim 62, wherein annealing comprises annealing in a vacuum atmosphere.

65. The method of claim 62, wherein annealing comprises annealing in a gas atmosphere.

66. The method of claim 62, wherein annealing comprises annealing in a non-hydrogen atmosphere and annealing in a hydrogen gas atmosphere.

67. The method of claim 56, further comprising depositing a second conductive material layer over the conductive material layer by electroplating.

68. The method of claim 56, further comprising depositing a second conductive material layer over the conductive material layer by chemical vapor deposition.

69. The method of claim 56, wherein depositing the conductive material comprises filling the feature.

70. The method of claim 56, wherein the catalytic layer is deposited over the substrate structure, wherein the catalytic layer acts as a barrier layer.

71. The method of claim 56, further comprising depositing a barrier layer over the substrate structure and then depositing the catalytic layer over the barrier layer.

72. The method of claim 56, further comprising depositing a barrier layer over the substrate structure and depositing a conductive seed layer over the barrier layer and then depositing the catalytic layer over the conductive seed layer.

73. The method of claim 56, wherein the Group IV metal comprises tin.

74. The method of claim 56, wherein the noble metal comprises a metal selected the group consisting of palladium and platinum.

75. The method of claim 56, wherein the semi-noble metal comprises a metal selected from the group consisting of cobalt, nickel, and tungsten.

76. The method of claim 56, wherein depositing the catalytic layer comprises contacting the substrate structure with an electroless deposition solution comprising Group IV metal ions and comprising metal ions selected from the group consisting of noble metal ions, semi-noble metal ions, and combinations thereof.

77. The method of claim 56, wherein depositing the catalytic layer comprises contacting the substrate structure with a first electroless deposition solution comprising Group IV metal ions, and contacting the substrate structure with a second electroless deposition solution comprising noble metal ions, semi-noble metal ions, and combinations thereof.

78. A method of depositing a conductive material in a sub-micron feature formed on a substrate structure of a substrate comprising:
depositing a catalytic layer by electroless deposition, the catalytic layer comprising a metal selected from the group consisting of a noble metal, a semi-noble metal, and combinations thereof and comprising a Group IV metal;
depositing a copper layer over the catalytic layer by electroless deposition; and
biasing the substrate structure.

79. The method of claim 78, wherein biasing the substrate structure comprises biasing the substrate structure during depositing the catalytic layer.

80. The method of claim 78, wherein biasing the substrate structure comprises biasing the substrate structure during depositing the copper layer.

81. The method of claim 78, wherein biasing the substrate structure comprises coupling a positive pole of a power supply to a conductive portion of the substrate structure and coupling a negative pole of the power supply to an electrode in contact with an electroless deposition solution.

82. The method of claim 81, wherein the power supply provides a cell potential of less than +0.337 V.

83. The method of claim 78, wherein biasing the substrate comprises coupling a negative pole of a power supply to a conductive portion of the substrate structure and coupling a positive pole of the power supply to an electrode in contact with an electroless deposition solution.

84. The method of claim 83, wherein the power supply provides a cell potential of less than +0.337 V.

85. The method of claim 83, wherein biasing the substrate structure comprises applying a bias for a time period between about a millisecond and about one second.

86. The method of claim 83, wherein biasing the substrate structure comprises applying a bias for a time period of least one second.

87. The method of claim 78, wherein biasing the substrate structure comprises coupling one pole of a power supply to a conductive portion of the substrate and coupling another pole of the power supply to an electrode in contact with an electroless deposition solution and comprises reversing the polarity of the power supply back and forth.

88. The method of claim 78, further comprising depositing a second copper layer over the copper layer by electroplating.

89. The method of claim 78, further comprising depositing a second copper layer over the copper layer by chemical vapor deposition.

90. The method of claim 78, wherein depositing the copper layer comprises filling the feature.

91. The method of claim 78, wherein the Group IV metal comprises tin.

92. The method of claim 78, wherein the noble metal comprises a metal selected the group consisting of palladium and platinum.

93. The method of claim 78, wherein the semi-noble metal comprises a metal selected from the group consisting of cobalt, nickel, tungsten, and combinations thereof.

94. The method of claim 78, wherein depositing the catalytic layer comprises contacting the substrate structure with an electroless deposition solution comprising Group IV metal ions and comprising metal ions selected from the group consisting of noble metal ions, semi-noble metal ions, and combinations thereof.

95. The method of claim 78, wherein depositing the catalytic layer comprises contacting the substrate structure with a first electroless deposition solution comprising Group IV metal ions, and contacting the substrate structure with a second electroless deposition solution comprising noble metal ions, semi-noble metal ions, and combinations thereof.

96. A method of depositing a conductive material in a sub-micron feature formed on a substrate structure of a substrate, comprising:
depositing a catalytic layer by electroless deposition, the catalytic layer comprising a metal selected from the group consisting of a noble metal, a semi-noble metal, and combinations thereof and comprising a Group IV metal;
depositing a conductive material layer to a thickness of less than about 500 Å over the catalytic layer by electroless deposition; and
depositing a second conductive material layer over the conductive material layer.

97. A method of depositing a conductive material in a sub-micron feature formed on a substrate structure of a substrate, comprising:
depositing a barrier layer over the substrate structure and then depositing a catalytic layer over the barrier layer by electroless deposition, the catalytic layer comprising a metal selected from the group consisting of a noble metal, a semi-noble metal, and combinations thereof and comprising a Group IV metal; and
depositing a conductive material layer to a thickness of less than about 500 Å over the catalytic layer by electroless deposition.

98. A method of depositing a conductive material in a sub-micron feature formed on a substrate structure of a substrate, comprising:

depositing a barrier layer over the substrate structure;

depositing a conductive seed layer over the barrier layer and then depositing a catalytic layer over the conductive seed layer by electroless deposition, the catalytic layer comprising a metal selected from the group consisting of a noble metal, a semi-noble metal, and combinations thereof and comprising a Group IV metal; and depositing a conductive material layer to a thickness of less than about 500 Å over the catalytic layer by electroless deposition.

99. A method of depositing a conductive material in a sub-micron feature formed on a substrate structure of a substrate, comprising:

depositing a catalytic layer by electroless deposition, the catalytic layer comprising a metal selected from the group consisting of a noble metal, a semi-noble metal, and combinations thereof and comprising a Group IV metal; and depositing a conductive material layer to a thickness of less than about 500 Å over the catalytic layer by electroless deposition, wherein the catalytic layer is deposited to a thickness between about 5 Å to about 100 Å.

100. A method of depositing a catalytic layer in a sub-micron feature formed on a substrate structure of a substrate, comprising:

contacting the substrate structure with an electroless deposition solution comprising Group IV metal ions and comprising metal ions selected from the group consisting of a noble metal, a semi-noble metal, and combinations thereof for a time period of between about 30 seconds and about 120 seconds at a reaction temperature between about 20° C. to about 150° C., wherein contacting the substrate structure with the electroless deposition solution comprises contacting the substrate structure with between about 3 ml and about 200 ml of the electroless deposition solution for a 200 mm substrate.

101. A method of depositing a catalytic layer in a sub-micron feature formed on a substrate structure of a substrate, comprising:

contacting the substrate structure with a first electroless deposition solution comprising Group IV metal ions; and contacting the substrate structure with a second electroless deposition solution comprising metal ions selected from the group consisting of noble metal ions, semi-noble metal ions, and combinations thereof, wherein contacting the substrate structure with the first electroless deposition solution comprises contacting the substrate structure with between about 3 ml and about 200 ml of the first electroless deposition solution for a 200 mm substrate.

102. A method of depositing a catalytic layer in a sub-micron feature formed on a substrate structure of a substrate, comprising: contacting the substrate structure with a first electroless deposition solution comprising Group IV metal ions; and contacting the substrate structure with a second electroless deposition solution comprising metal ions selected from the group consisting of noble metal ions, semi-noble metal ions, and combinations thereof, wherein contacting the substrate structure with the second electroless deposition solution comprises contacting the substrate structure with between about 3 ml and about 200 ml of the second electroless deposition solution for a 200 mm substrate.

* * * * *

UNITED STATES PATENT AND TRADEMARK OFFICE
CERTIFICATE OF CORRECTION

PATENT NO. : 6,824,666 B2 Page 1 of 1
APPLICATION NO. : 10/059822
DATED : November 30, 2004
INVENTOR(S) : Gandikota Srinivas et al.

It is certified that error appears in the above-identified patent and that said Letters Patent is hereby corrected as shown below:

In column 25, line 29, delete "by product" and replace with "byproduct"

In column 34, line 33, after "thereof and" delete "a-".

In column 34, line 40, after "claim" delete "55" and replace with "57".

In column 34, line 48, after "57," insert "wherein".

Signed and Sealed this

Eleventh Day of July, 2006

JON W. DUDAS
*Director of the United States Patent and Trademark Office*